(12) United States Patent
Fujii et al.

(10) Patent No.: US 11,217,721 B2
(45) Date of Patent: Jan. 4, 2022

(54) LIGHT-EMITTING DEVICE AND DISPLAY APPARATUS

(71) Applicant: SONY CORPORATION, Tokyo (JP)

(72) Inventors: Kentaro Fujii, Kanagawa (JP); Tomoki Ono, Kanagawa (JP); Yoshiaki Watanabe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 244 days.

(21) Appl. No.: 15/781,388

(22) PCT Filed: Sep. 30, 2016

(86) PCT No.: PCT/JP2016/004421
§ 371 (c)(1),
(2) Date: Jun. 4, 2018

(87) PCT Pub. No.: WO2017/110017
PCT Pub. Date: Jun. 29, 2017

(65) Prior Publication Data
US 2018/0366612 A1    Dec. 20, 2018

(30) Foreign Application Priority Data
Dec. 25, 2015 (JP) .............................. JP2015-253179

(51) Int. Cl.
*H01L 33/00* (2010.01)
*G02B 26/10* (2006.01)
(Continued)

(52) U.S. Cl.
CPC ........ *H01L 33/0045* (2013.01); *G02B 6/1223* (2013.01); *G02B 26/10* (2013.01);
(Continued)

(58) Field of Classification Search
CPC . H01L 33/0045; H01L 33/0062; H01L 33/30; H01L 33/38; H01L 33/20;
(Continued)

(56) References Cited

U.S. PATENT DOCUMENTS

2002/0024052 A1* 2/2002 Liang .................. H01L 33/0045
257/79
2004/0126063 A1* 7/2004 Alphonse ............... G02B 6/125
385/43
(Continued)

FOREIGN PATENT DOCUMENTS

JP    02-310975 A    12/1990
JP    08-236853 A    9/1996
(Continued)

OTHER PUBLICATIONS

International Search Report and Written Opinion of PCT Application No. PCT/JP2016/004421, dated Dec. 13, 2016, 10 pages of ISRWO.

*Primary Examiner* — Benjamin Tzu-Hung Liu
(74) *Attorney, Agent, or Firm* — Chip Law Group

(57) ABSTRACT

Provided is a light-emitting device that includes a first electrode layer, a first conduction type layer, a second conduction type layer, an active layer, and a second electrode layer. The first conduction type layer includes a current injection region formed by the first electrode layer and a current non-injection region. A waveguide structure included in the first conduction type layer, the active layer, and the second conduction type layer includes a first region and a second region. The first region has a first waveguide that is the current injection region and the current non-injection region and has a first refractive index difference. The second region has a second waveguide arranged to be extended from the first waveguide to the first end and has a second refractive index difference greater than the first
(Continued)

refractive index difference. The second waveguide has a region narrowing toward the first end.

15 Claims, 15 Drawing Sheets

(51) Int. Cl.
| | |
|---|---|
| *G02B 6/122* | (2006.01) |
| *H01L 33/30* | (2010.01) |
| *H01L 33/38* | (2010.01) |
| *H01S 5/22* | (2006.01) |
| *H01L 33/20* | (2010.01) |
| *F21V 8/00* | (2006.01) |

(52) U.S. Cl.
CPC .......... *H01L 33/0062* (2013.01); *H01L 33/20* (2013.01); *H01L 33/30* (2013.01); *H01L 33/38* (2013.01); *H01S 5/2209* (2013.01); *G02B 6/0073* (2013.01)

(58) Field of Classification Search
CPC .... G02B 26/10; G02B 6/1223; G02B 6/0073; H01S 5/2209
See application file for complete search history.

(56) References Cited

U.S. PATENT DOCUMENTS

| | | | | |
|---|---|---|---|---|
| 2014/0241391 | A1* | 8/2014 | Abe | .......................... H01S 5/22 372/45.012 |
| 2016/0190385 | A1* | 6/2016 | Nishioka | ................. H01L 33/20 353/85 |

FOREIGN PATENT DOCUMENTS

| | | | |
|---|---|---|---|
| JP | 08236853 | * | 9/1996 |
| JP | 2002-076432 | A | 3/2002 |
| JP | 2003-347637 | A | 12/2003 |
| JP | 2012-33797 | A | 2/2012 |
| JP | 2012-033797 | A | 2/2012 |
| JP | 2013-004855 | A | 1/2013 |
| JP | 2014-096513 | A | 5/2014 |
| JP | 2015-146397 | A | 8/2015 |
| WO | 2012/017505 | A1 | 2/2012 |
| WO | 2015/163057 | A1 | 10/2015 |

* cited by examiner

LIGHT-EMITTING DEVICE AND DISPLAY APPARATUS

CROSS REFERENCE TO RELATED APPLICATIONS

This application is a U.S. National Phase of International Patent Application No. PCT/JP2016/004421 filed on Sep. 30, 2016, which claims priority benefit of Japanese Patent Application No. JP 2015-253179 filed in the Japan Patent Office on Dec. 25, 2015. Each of the above-referenced applications is hereby incorporated herein by reference in its entirety.

TECHNICAL FIELD

The present technology relates to a technology of a semiconductor laser and a super luminescent diode (SLD).

BACKGROUND ART

As a light-emitting device, a super luminescent diode (SLD) has a feature of having a wide light-emitting spectrum width relatively close to that of a light-emitting diode and of emitting light at a narrow angle of radiation with a high intensity like a semiconductor laser in a light-emitting state at the same time.

An SLD disclosed in Patent Literature 1 includes a linear ridge waveguide formed orthogonal to a cleavage end face and a curved guide active layer continuously arranged in a curve in a plan view. At a cleavage end face, an AR (antireflection) film may be used. In the SLD having such a structure, the most part of light generated on the active layer directly under the linear ridge waveguide proceeds toward the curved guide active layer. The light proceeding toward the curved guide active layer is separated into light leaked due to the curve, light guided to an end face (end face at an opposite side of a cleavage end face) and reflected by the end face, and light absorbed while being guided. According to this structure, as the light leaked due to the curve and the light reflected by the opposite end of the cleavage end face cannot be returned to a linear active layer, laser mode oscillation is inhibited (for example, see Patent Literature 1, p. 2, lower right column to p. 3, upper left column, FIG. 1).

In short, the SLD does not have the structure that light goes to and fro between mirrors arranged on both end faces like a general laser diode (LD) but has the structure that light is passed through the waveguide in one way and is amplified (stimulated emission occurs). A different point between the both is that a spectrum width of a wavelength of output light of the SLD is much wider than that of the LD.

Patent Literature 2 discloses a semiconductor laser structure (not an SLD). The semiconductor laser includes a ridge and a wing arranged on a top of a second clad layer, i.e., a p-type clad layer and a groove formed from an upper face of the p-type clad layer to the inside between the ridge and the wing. In relation to widths of the ridge and the groove in the horizontal direction (direction orthogonal to the light emission direction), a groove width at a region of a rear end face side is narrower than a groove width at a region of a front end face side. This structure allows the emission loss of high order lateral mode light to be suppressed (for example, see Patent Literature 2, specification paragraphs [0036], [0058], and [0077], and FIGS. 1 and 2).

CITATION LIST

Patent Literature

Patent Literature 1: Japanese Patent Application Laid-open No. 2-310975
Patent Literature 2: Japanese Patent Application Laid-open No. 2013-4855

DISCLOSURE OF INVENTION

Technical Problem

In a light-emitting device, enlarging a current-carrying area, e.g., enlarging a stripe width, allows high-output. With the enlarged stripe width, a light confinement width is enlarged and the size of a spot of an emitted beam is increased. Depending on the usage of the light-emitting device, a large spot size beam may be difficult to be handled. In other words, it is difficult to increase a light output and inhibit enlargement of the light confinement width at the same time.

The present disclosure is made in view of the above-mentioned circumstances, and it is an object of the present disclosure to provide a light-emitting device and a display apparatus that high-output can be achieved without enlarging a beam spot size.

Solution to Problem

In order to achieve the object, a light-emitting device according to an embodiment of the present technology includes a substrate, a first end being a light-outgoing end, and a second end arranged at a side opposite to the first end. The light-emitting device includes a first electrode layer, a first conduction type layer, a second conduction type layer, an active layer, and second electrode layer.

The first electrode layer is a stripe-shaped electrode layer extending from the second end to the first end.

The first conduction type layer includes a current injection region formed by the first electrode layer and a current non-injection region.

The second conduction type layer is arranged on the substrate.

The active layer is arranged between the first conduction type layer and the second conduction type layer.

The second electrode layer is in contact with the substrate or the second conduction type layer.

A waveguide structure included in the first conduction type layer, the active layer, and the second conduction type layer includes a first region and a second region arranged between the first region and the first end.

The first region has a first waveguide that is the current injection region and the current non-injection region and has a first refractive index difference between a refractive index of the current injection region and a refractive index of the current non-injection region.

The second region has a second waveguide arranged to be extended from the first waveguide to the first end and has a second refractive index difference between a refractive index of the second waveguide and a refractive index of a region around the second waveguide in the second region, the second refractive index difference being greater than the first refractive index difference.

The second waveguide has a region narrowing toward the first end.

Since the second refractive index difference in the second region is greater than the first refractive index difference in the first region and the second waveguide of the second region has the narrower width toward the first end region, a light confinement action in the second region is promoted. Thus, without increasing a beam spot size, high-output can be achieved.

The first region of the waveguide structure may have first recesses arranged to sandwich the first waveguide as the current non-injection region. The second region of the waveguide structure may have second recesses arranged to sandwich the second waveguide as the region around the second waveguide, the second recesses being deeper than the first recesses.

Since the second recesses are deeper than the first recesses in the waveguide structure, it allows that the second refractive index difference in the second region being greater than the first refractive index difference in the first region.

The second recesses may include bottom faces arranged at a position deeper than a position of the active layer.

According to this structure, the light confinement action in the second waveguide can be promoted.

The light-emitting device may further includes a dielectric layer covering the second recesses.

A first width being an end width of a first region side of the second waveguide may be wider than a second width being an end width of a second region side of the first waveguide.

According to this structure, all amount of light generated and transmitted in the first waveguide can be reliably led to the second waveguide and the light loss can be suppressed.

A third width being a width at the first end of the second waveguide may be narrower than the second width. According to this structure, a beam spot size can be decreased and high-output can be promoted.

The second waveguide may include a linear waveguide linearly arranged along the longitudinal direction of the second waveguide.

The linear waveguide may be extended to the first end and a linear direction along the longitudinal direction of the linear waveguide may not be orthogonal to an end face of the first end.

For example, where the first waveguide is nonlinear, the SLD having the structure that inhibits a laser oscillation can be achieved.

The second waveguide may further include a nonlinear waveguide nonlinearly arranged and extended from the linear waveguide.

The second waveguide may include a nonlinear waveguide nonlinearly arranged.

For example, where the first waveguide is nonlinear, the SLD having the structure that inhibits a laser oscillation can be achieved.

The nonlinear waveguide may not be orthogonal to an end face of the first end in the direction along the longitudinal direction of the nonlinear waveguide at the first end.

The first waveguide may include at least one of a nonlinear waveguide nonlinearly arranged and a linear waveguide linearly arranged along the longitudinal direction of the first waveguide.

According to this structure, the SLD having the structure that inhibits a laser oscillation can be achieved.

The first waveguide may include a tapered waveguide having a narrower width toward the second end in a region from the second end to ½ of the length from the first end to the second end.

For example, where only the first end is the light-outgoing end and the second end is a reflection end, by decreasing a current injection amount of the first waveguide in a region close to the second end (region from the second end to ½ of the length from the first end to the second end), a current injection amount of the waveguide in a region close to the first end can be increased. According to this structure, efficiency of the stimulated emission of the waveguide close to the first end can be increased and high-output can be achieved.

The tapered waveguide may have the narrowest width at the second end.

A linear direction along the longitudinal direction of the tapered waveguide may be orthogonal to the second end face.

According to this structure, the angle of light reflection in the second end can be decreased and efficiency of light utilization can be increased.

A display apparatus according to an embodiment of the present technology includes the above-described light-emitting device and an image generation unit.

The image generation unit is capable of two-dimensionally scanning light outgoing from the light-emitting device and controlling brightness of projected light on the basis of image data.

Advantageous Effects of Invention

As described above, according to the present technology, high-output can be achieved without enlarging the light confinement width, i.e., without enlarging the beam spot size.

Note that the effects described here are not necessarily limitative and may be any of effects described in the present disclosure.

MODE(S) FOR CARRYING OUT THE INVENTION

Hereinafter, embodiments of the present technology will be described with reference to the drawings. In the following description, with reference to the drawings, words such as "up", "down", "left", "right", "vertical", and "horizontal" may be used to indicate the directions and positions of devices and components. These words are only for convenience of description. In other words, these words are often used for ease of description and may not correspond to the directions and positions in a situation devices and apparatuses are actually manufactured and used.

1. Light-Emitting Device

1.1) Structure of Light-Emitting Device

Figure 1:
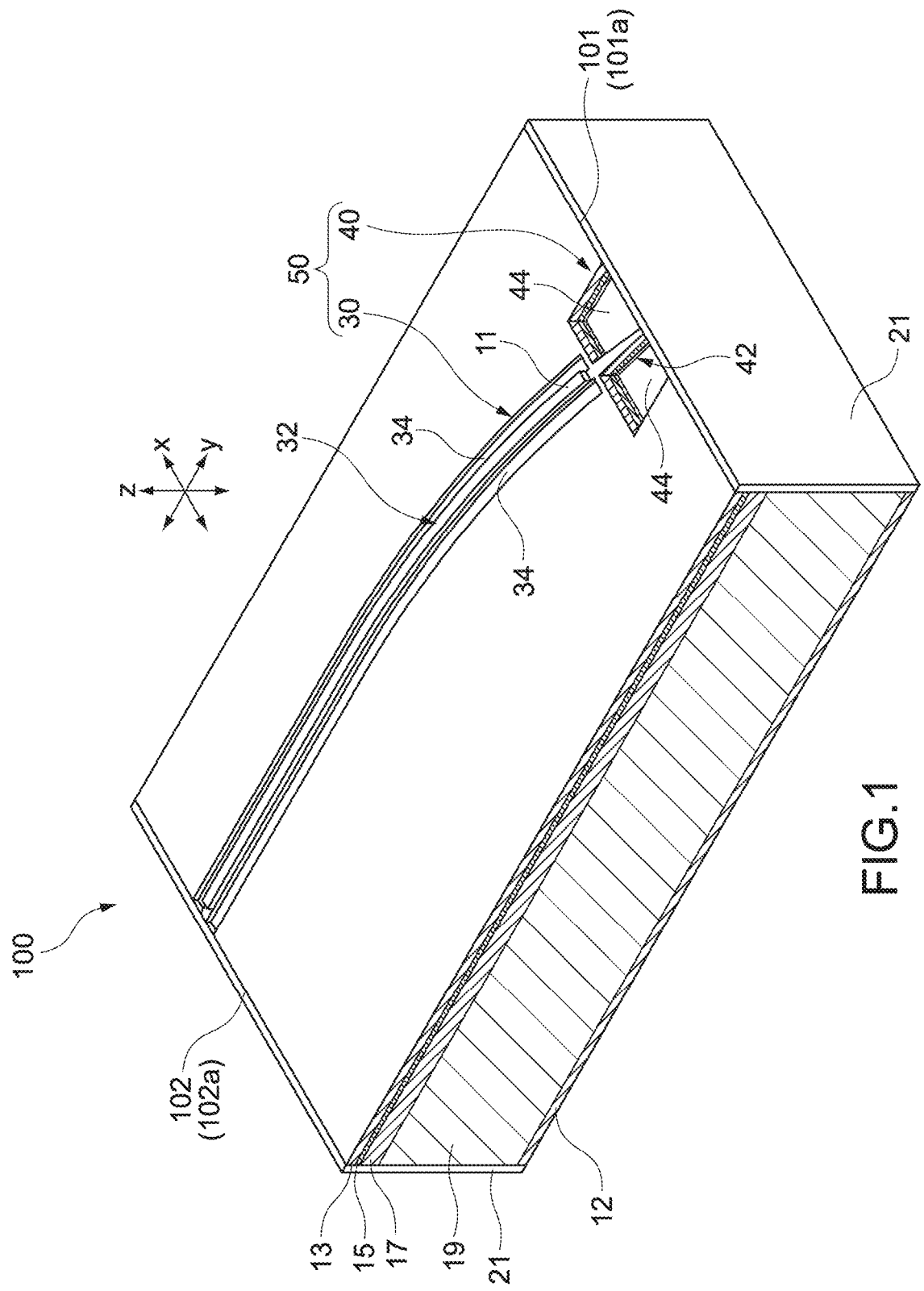
FIG. 1 is a perspective view showing a light-emitting device according to an embodiment of the present technology.
Figure 2:
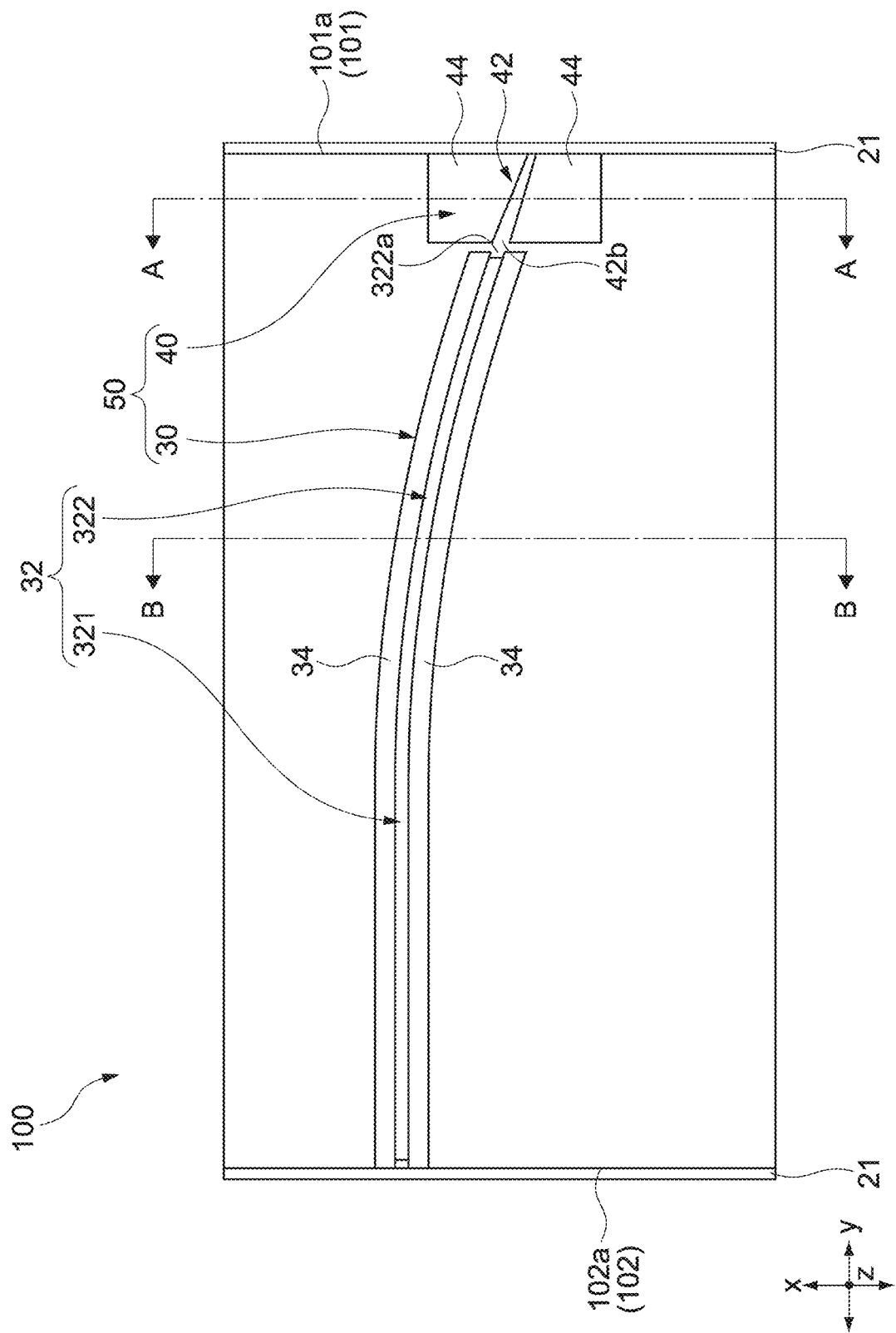
FIG. 2 is a plan view showing the light-emitting device of FIG. 1.

FIG. 1 is a perspective view showing a light-emitting device 100 according to an embodiment of the present technology. FIG. 2 is a plan view showing the light-emitting device of FIG. 1. The light-emitting device 100 according to this embodiment is a super luminescent diode (SLD) including a ridge-type waveguide. At left of FIG. 1, an enlarged cross section of semiconductor layers of the light-emitting device 100 is mainly shown.

As shown in FIG. 1, the light-emitting device 100 includes a first electrode layer 11, a first conduction type layer 13, an active layer 15, a second conduction type layer 17, a substrate 19, and a second electrode layer 12 in this order from an upper layer side. The first conduction type layer 13 is, for example, of a p-type conduction type and the second conduction type layer 17 is, for example, of an n-type conduction type. Also with reference to FIG. 3B, the structure of each layer is easily understood.

The first conduction type layer 13 includes a clad layer and a guide layer (not shown) in this order formed from a first electrode layer 11 side. The second conduction type layer 17 includes a clad layer and a guide layer (not shown) in this order formed from a substrate 19 side. The second electrode layer 12 is arranged being in contact with a back surface of the substrate 19.

Note that the first conduction type layer 13 may include a contact layer in a region being in contact with the first electrode layer 11. In addition, an n-type buffer layer may be arranged between the substrate 19 and the second conduction type layer 17. The second electrode layer 12 may be arranged being in directly contact with the second conduction type layer 17.

The light-emitting device 100 includes a light-outgoing end (first end) 101 and a rear end 102 being an opposite end (second end). Dielectric films 21 are arranged on the light-outgoing end 101 and the rear end 102, respectively. The dielectric film 21 arranged on the light-outgoing end 101 has a low reflectance. The dielectric film 21 arranged on the rear end 102 has a high reflectance.

Hereinafter, the longitudinal direction of the light-emitting device 100 is denoted by the y direction and the orthogonal direction is denoted by the x direction for the purpose of description. In addition, the direction orthogonal to the x and y directions denotes the z direction.

Note that according to this embodiment, the "light-outgoing end" and the "rear end" mean ends of the device formed of a semiconductor material. In this sense, the materials of the "light-outgoing end" and the "rear end" do not include the dielectric films 21 arranged on both end faces. However, even if the "light-outgoing end" and the "rear end" of the light-emitting device 100 may include the dielectric films 21, there are no contradictions in the following description.

Figure 3A:
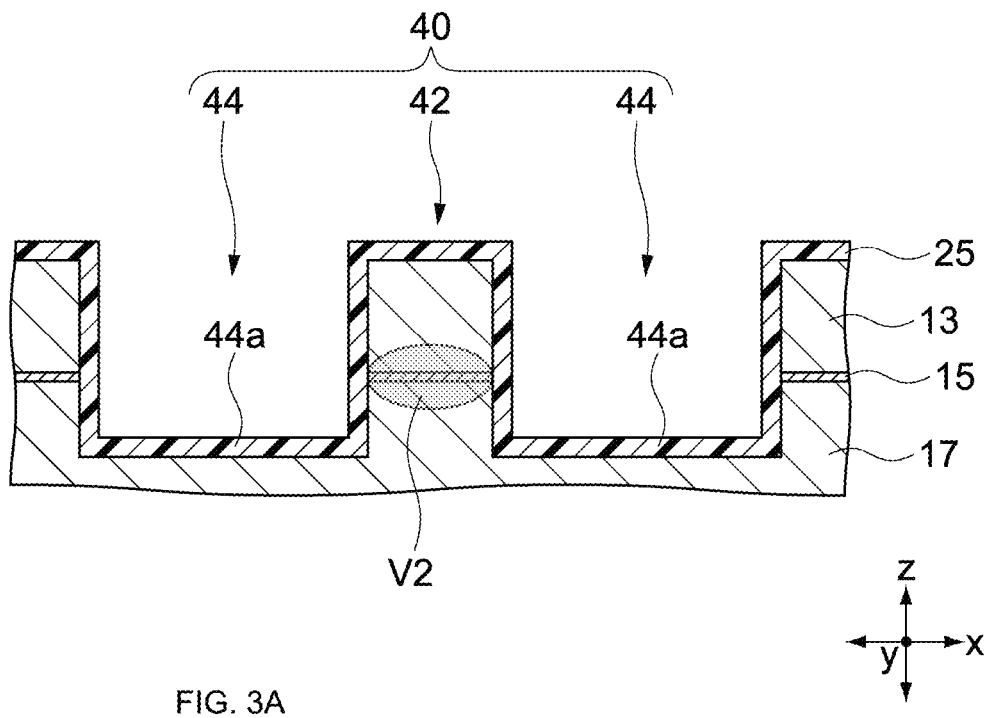
FIG. 3A is a sectional view taken along the line A-A of FIG. 2.
Figure 3B:
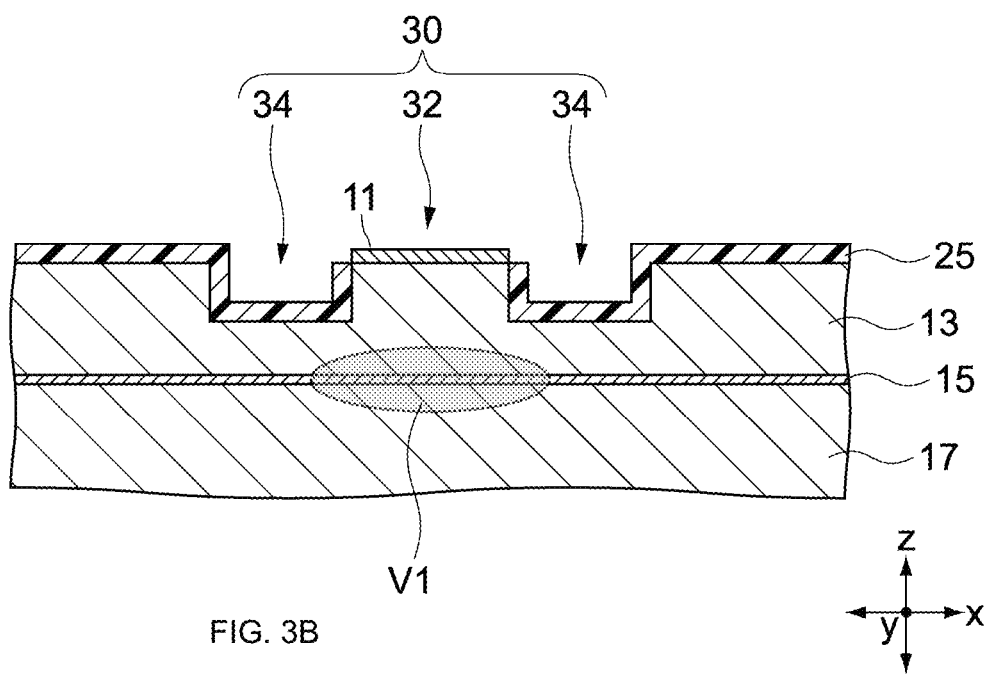
FIG. 3B is a sectional view taken along the line B-B of FIG. 2.

FIG. 3A is a sectional view taken along the line A-A of FIG. 2. FIG. 3B is a sectional view taken along the line B-B of FIG. 2. Note that in FIGS. 3A and 3B, the dielectric layer 25 is arranged on the upper surface of the light-emitting device 100 but in FIGS. 1 and 2, the dielectric layer 25 is not shown.

As shown in FIGS. 1 and 2, the first electrode layer 11 has a stripe shape extending from the rear end 102 to the light-outgoing end 101 and the ridge-type waveguide structure 50 is formed as described above. Also, the first electrode layer 11 includes a nonlinear region and the waveguide formed in accordance with the shape of the first electrode layer 11 includes the nonlinear region as described below.

The "nonlinear" typically means a curve but also includes a zigzag line and a step-like line. The "curve" includes an arc, a quadratic curve, or a concept of combining them.

Figure 4:
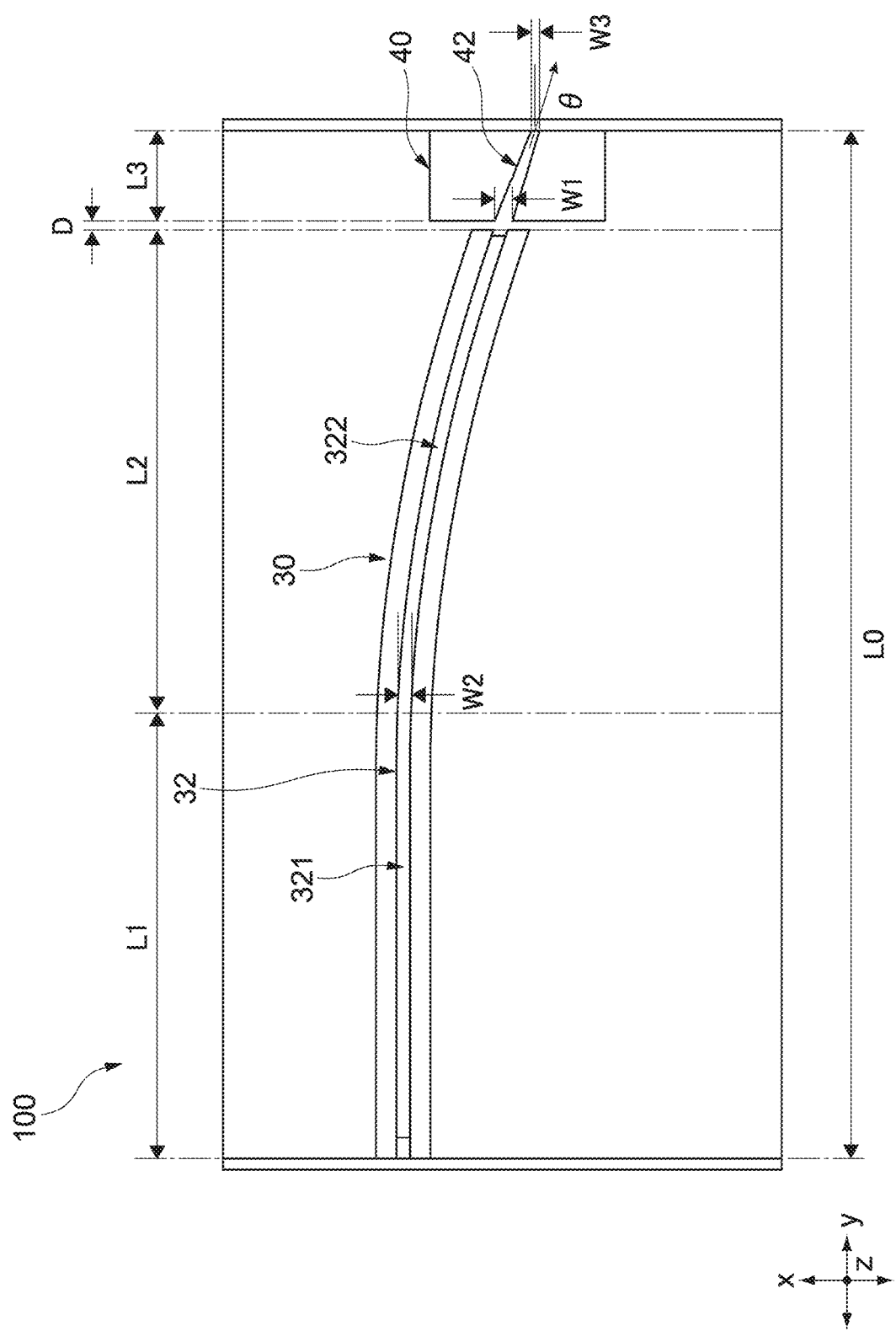
FIG. 4 is a view showing a size of each region of the light-emitting device.

The first conduction type layer 13, the active layer 15, and the second conduction type layer 17 include the waveguide structure 50 including a first region 30 and a second region 40 separately arranged in the y direction of the longitudinal direction of the light-emitting device 100. FIG. 4 shows a size of each region of the light-emitting device 100. The first region 30 of the waveguide structure 50 has a waveguide structure arranged apart from the rear end 102 by the length of L1+L2 in the y direction. The second region 40 of the waveguide structure 50 has a waveguide structure arranged at the region from the end of the first region 30 at a light-outgoing end to the light-outgoing end 101. In other words, the second region 40 is arranged between the first region 30 and the light-outgoing end 101.

As shown in FIG. 3B, the first electrode layer 11 forms a current injection region mainly on the first conduction type layer 13. The first region 30 of the waveguide structure 50 includes a first waveguide 32 that is the current injection region and a current non-injection region, into which no current is injected, arranged around the first waveguide 32. The first waveguide 32 is mainly formed of a ridge. The current non-injection region is mainly first recesses 34 arranged to sandwich the first waveguide 32. In other words, the first region 30 has a so-called double ridge (w-ridge) structure.

In the first conduction type layer 13, a current is diffused from the first electrode layer 11 to the active layer 15 spreading to some extent. In the first region 30, the region of the first conduction type layer 13 (and the second conduction type layer 17) in which a current flows is referred to as the current injection region and the regions other than that are referred to as the current non-injection regions. In other words, the current injection region and the current non-injection regions form a current constriction structure. The first region 30 of the waveguide structure 50 can increase a current density. A high-output light beam is generated at a limited region shown by a symbol V1 of FIG. 3B.

A first refractive index difference is generated between a light refractive index of the current injection region (first waveguide 32) and a light refractive index of the current non-injection regions (first recesses 34). The first refractive index difference is a value calculated as an equivalent refractive index difference that is changed depending on the depths of the first recesses 34.

As shown in FIG. 3A, the second region 40 of the waveguide structure 50 includes a second waveguide 42 arranged extending from the first waveguide 32 to the light-outgoing end 101 and second recesses 44 arranged to sandwich the second waveguide 42. The second waveguide 42 is a convex region formed of a semiconductor extended from the first waveguide 32 and has no first electrode layer 11. The depths of the second recesses 44 are deeper than the depths of the first recesses 34 of the first region 30.

A second refractive index difference is generated between a light refractive index of the second waveguide 42 and a light refractive index of the second recesses 44. The second refractive index difference is a value calculated as an equivalent refractive index difference that is changed depending on the depths of the second recesses 44. The depths of the first recess 34 and the second recesses 44 are designed so that the second refractive index difference is greater than the first refractive index difference of the first region 30. As described above, since the depths of the second recess 44 are deeper than the depths of the first recesses 34, the second refractive index difference can be designed to be greater than the first refractive index difference. Such waveguide structure 50 generates a light confinement action shown by a symbol V2 of FIG. 3A.

As shown in FIG. 3A, the depths of the second recesses 44 are typically set such that the second recesses 44 have bottom faces 44a at positions deeper than the position of the active layer 15. Thus, the difference between the first refractive index difference and the second refractive index difference can be increased.

In addition, the second waveguide 42 has a region having a narrower width toward the light-outgoing end 101 as shown in FIG. 2. In this embodiment, the second waveguide 42 in whole has the narrower width toward the light-outgoing end 101.

Note that the surfaces of the first recesses 34 and the second recesses 44 are covered with the dielectric layer 25, respectively, as described above. Typically, the first recesses 34 and the second recesses 44 covered with the dielectric layer 25 are filled with an electrically conductive material including the first electrode layer 11 or other suitable material.

The waveguide structure 50 having the second region 40 structured as described above provides the following advantages. Specifically, since the second refractive index difference of the second region 40 is greater than the first refractive index difference of the first region 30 and the second waveguide 42 of the second region 40 has the narrower width toward the light-outgoing end 101, the light confinement action in the second region 40 is promoted. Thus, without increasing a beam spot size, high-output can be achieved.

1.2) Local Configuration and Size of Light-Emitting Device

As shown in FIG. 2, the first waveguide 32 in the first region 30 includes a linear waveguide 321 linearly arranged along the longitudinal direction thereof and a curve waveguide (nonlinear waveguide) 322 extended from the linear waveguide 321. The linear waveguide 321 is arranged closer to a rear end 102 side than the curved waveguide is. As shown in FIG. 4, an end 322a of the curved waveguide 322 faces to an end 42b of the second waveguide 42 in the second region 40.

The longitudinal direction of the linear waveguide 321 is orthogonal to the rear end face 102a, for example, so as to transmit light as much as possible to the light-outgoing end 101. However, it may not be necessarily orthogonal.

With reference to FIG. 4, a total length L0 of (a semiconductor device of) the light-emitting device 100 is, for example, 1000 μm or more and 4000 μm or less, typically 2200 μm. The total length L0 is not limited to the range. Note that the total length L0 may be the length including the thicknesses of the dielectric films 21 at both ends.

A ratio of a length L1 of the linear waveguide 321 and a length L2 of the curved waveguide 322 of the first waveguide 32 is typically set to about 1:1 but is not limited thereto. Note that where L0 is 2200 μm, L1 is 990 μm and L2 is 1000 μm, for example. As a matter of course, L1 may be longer than L2. A curvature of the curved waveguide 322 may be such that light is transmitted by an effective refractive index difference in the first region 30, for example.

Since a reflection at a light-outgoing end face 101a is inhibited by arranging the curved waveguide 322, the SLD having the structure that inhibits a laser oscillation can be achieved.

Note that the region of the linear waveguide 321 of the first waveguide 32 is mainly a region where carriers are recombined in the active layer 15 to generate light (spontaneous emission light). Hereinafter, this region is referred to as an "LED region" for convenience. On the other hand, the region of the curved waveguide 322 of the first waveguide 32 is mainly a region where the carriers are recombined to generate the spontaneous emission light and the spontaneous emission light is amplified. Hereinafter, this region is referred to as a "light amplifying region" for convenience. As a matter of course, the LED region and the light amplifying region are not explicitly separated. However, the actions of light at the linear waveguide 321 and the curved waveguide 322 are roughly distinguished as described above.

Figure 5:
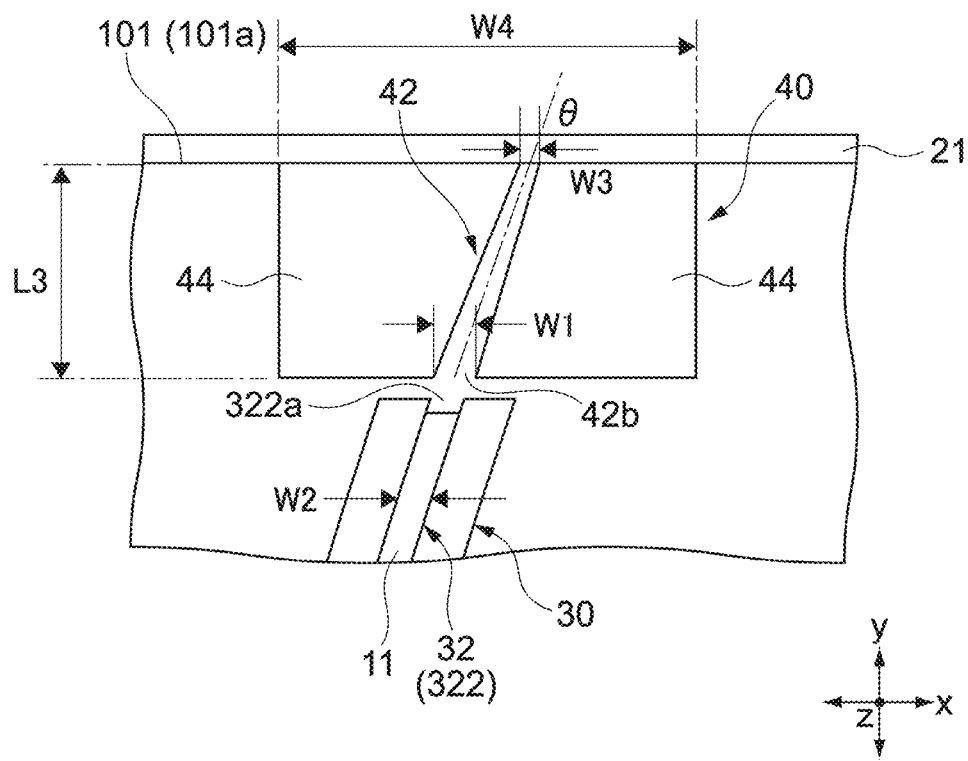
FIG. 5 is a plan view mainly showing a second region of a waveguide structure in an enlarged state.

FIG. 5 is a plan view mainly showing the second region 40 of the waveguide structure 50 in an enlarged state. The second waveguide 42 in the second region 40 is a waveguide (linear waveguide) extended from the first waveguide 32 and linearly arranged along the longitudinal direction of the second waveguide 42. The second waveguide 42 is extended to the light-outgoing end 101. The second waveguide 42 has a structure that the linear direction along the longitudinal direction is not orthogonal to the light-outgoing end face 101a (light-outgoing angle from the end face is θ).

The width W2 of the first waveguide 32 (second width) is 3 μm or more and 12 μm or less and is substantially uniform at any position in the longitudinal direction. However, the width W2 may not necessarily be uniform. More preferably, the width W2 is 5 μm or more and 10 μm or less, for example 6 μm, in order to achieve a high-output.

A length L3 of the second waveguide 42 in the y direction of the light-emitting device 100 is designed such that the angle of light transmitting in the second waveguide 42 (angle between the light and the y axis viewed from the z direction) is smaller than the critical angle determined on the basis of the second refractive index difference. The length L3 is, for example, 25 μm or more and 300 μm or less, preferably, 100 μm or more and 200 μm or less. The length L3 is typically 165 μm.

A width W1 (first width) of the end at a first region 30 side of the second waveguide 42 is, for example, 4 μm or more and 15 μm or less, preferably, 6 μm or more and 12 μm or less. The width W1 is typically 7 μm.

A width W3 (third width) of the end at a light-outgoing end 101 of the second waveguide 42 is, for example, 1 μm or more and 10 μm or less, preferably, 2 μm or more and 8 μm or less. The width W3 is not especially limited and may be designed to have a necessary beam spot size. The width W3 is typically 3.4 μm.

The relationship among the widths W1, W2, and W3 holds W1>W2>W3. In particular, since the width W1 is wider than the end width of a second region 40 side of the first waveguide (here, W2), all amount of light generated and transmitted in the first waveguide 32 can be reliably led to the second waveguide 42 and the light loss can be suppressed.

If the length L3 of the second region 40 in the y direction is smaller than 25 μm, the length from the position having the width W2 to the position having the width W3 is short and the angle of the side wall of the waveguide is acute. When it happens, light may leak out from the side wall. If the length L3 exceeds 300 μm, in the second region 40 where no first electrode layer 11 is arranged, the region not feeding a current is long and the amount of light generated is decreased.

The light-outgoing angle θ is 2 degrees or more and 15 degrees or less, preferably 4 degrees or more and 10 degrees or less. Typically, the light-outgoing angle θ is 5 degrees. If the light-outgoing angle θ is smaller than 2 degrees, light reflected from the light-outgoing end face 101a returns to the waveguide and laser oscillation may occur. The coefficient of coupling may be roughly $10^{-5}$. Because if the light-outgoing angle θ exceeds 15 degrees, the angle is close to the total reflection and the amount of outgoing light is decreased.

Note that, as shown in FIG. 5, an entire width W4 of the second recess 44 (or a surface area of the second recess 44 viewed from the z direction) is set as appropriate. As long as an adequate difference between the first refractive index difference and the second refractive index difference is provided, the surface area of the second recess 44 is not limited. The width W4 may be the same as the entire width of the first recess 34 of the first region 30.

In addition, as shown in FIG. 4, a predetermined space D is arranged between the first region 30 and the second region 40 but may not be present (D=0).

Figure 6:
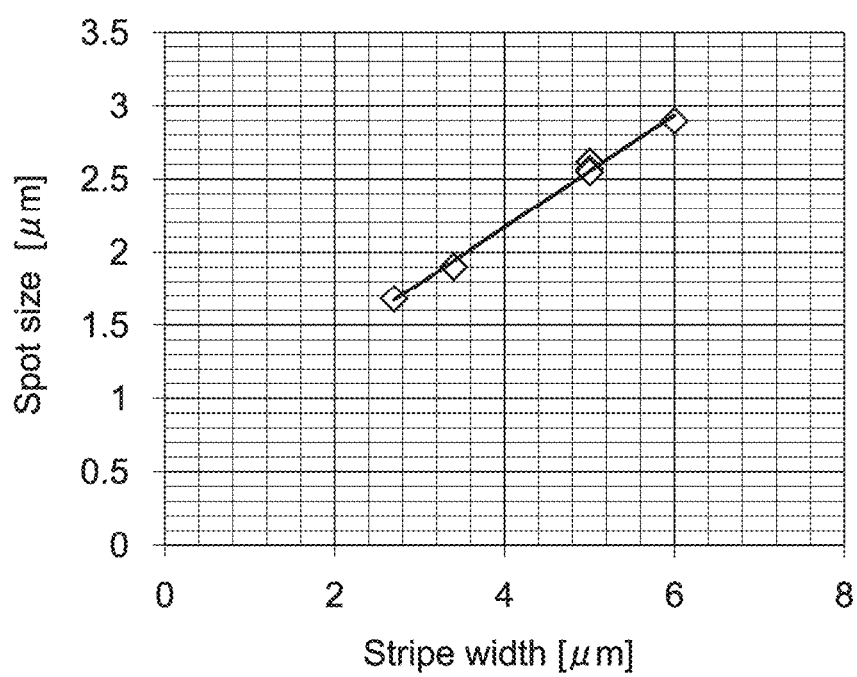
FIG. 6 is a graph showing a relationship between a stripe width (current-carrying area) and a beam spot size.

Here, as described above, enlarging a current-carrying area in order to achieve high-output (for example, enlarging the stripe width) increases the beam spot size. FIG. 6 is a graph demonstrating this. With the structure of the light-emitting device 100 according to this embodiment, the light confinement effect can be promoted. Thus, without enlarging a beam spot size, high-output can be achieved.

1.3) Illustrative Materials of Components of Light-Emitting Device and Production Method Thereof Next, a method of producing the light-emitting device 100 (SLD) according to this embodiment will be described. A method of producing red SLD, a method of producing a green SLD, and a method of producing a blue SLD will be described separately. The production method and the materials used described below are only typical examples and are not limited thereto.

1.3.1) Method of Producing Red SLD

Figure 7A:
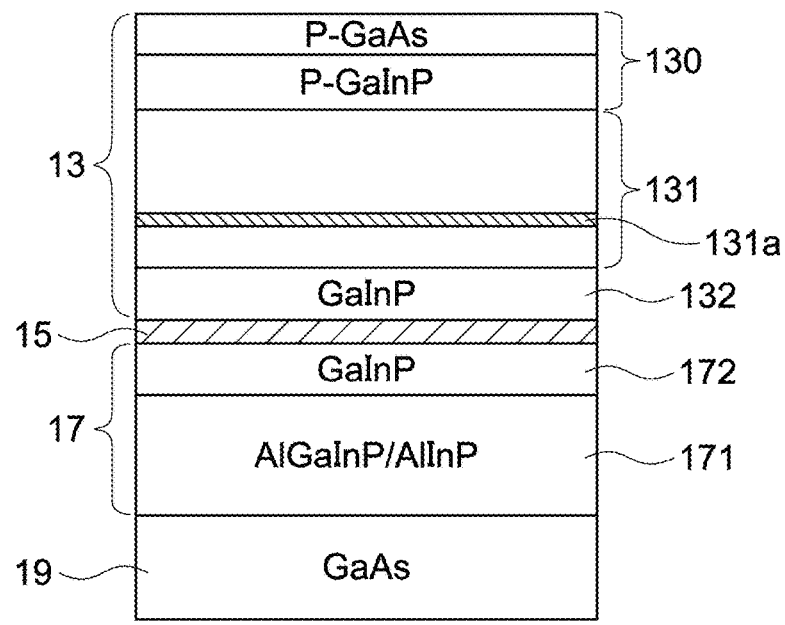
FIG. 7A is a cross-sectional view showing semiconductor layers for describing a method of producing a red SLD.

A method of producing a red SLD will be described. FIG. 7A is a cross-sectional view showing semiconductor layers of the light-emitting device 100 of the red SLD.

As a substrate 19 of the semiconductor, a GaAs substrate is used. On the GaAs substrate (at this point, wafer), the following crystal structure is formed by the MOCVD (Metal Organic Chemical Vapor Deposition) method.

An Si-doped n-type clad layer 171 formed of $Al_{0.5}In_{0.5}P$ is grown to have a thickness of about 3 μm. On the n-type clad layer, a guide layer 172 formed of $Ga_xIn_{1-x}P$ is grown to have a thickness of about 20 nm. An active layer 15 formed of $Ga_xIn_{1-x}P$ or $(Al_xGa_{1-x})_{0.5}In_{0.5}P$ is grown. The active layer 15 generally has a multiquantum well structure, and the width of a well and the number of wells are not especially limited. For example, the thickness of a well of the active layer 15 is about 80 angstrom.

On the active layer 15, a guide layer 132 formed of $Ga_xIn_{1-x}P$ is grown to have a thickness of about 40 nm. A Mg-doped p-type clad layer 131 formed of $Al_{0.5}In_{0.5}P$ is grown thereon.

As the material of the clad layer, a semiconductor having a composition, e.g., AlGaInP, may be used. The clad layer has a film thickness of, for example, about 1.5 μm.

During the growth of the p-type clad layer 131, an etching-stop layer 131a formed of $Ga_xIn_{1-x}P$ is formed. The etching-stop layer 131a may be formed of a material resistant to wet etching with ammonia hydrogen peroxide water or the like. The etching-stop layer 131a has a film thickness of, for example, about 5 nm.

Note that the etching-stop layer 131a is not shown in FIG. 1, etc. and is not described.

On the p-type clad layer 131 including the etching-stop layer 131a, a Mg-doped GaInP layer is grown. The Mg-doped GaAs layer is grown to form a contact layer 130.

Next, on regions on the wafer corresponding to the light-outgoing end face 101a and the rear end face 102a of the light-emitting device 100, window regions (not shown) are formed. This is for suppressing light absorption as low as possible. For the formation of the window regions, a technique of diffusing impurities (for example, Zn) into the semiconductor layer is used, for example. These window regions are not necessarily present. Alternatively, the window region may be formed on either one of the light-outgoing end face 101a and the rear end face 102a.

Next, the second region 40 (second waveguide 42 and second recess 44) of the waveguide structure 50 is formed. Specifically, $SiO_2$ mask openings corresponding to the shapes of the second recesses 44 are formed at the position corresponding to the second region 40 by photolithography. Via the openings, etching is performed by dry etching. By the dry etching treatment, the n-type clad layer 171 is etched to half. With the etching treatment, as described above, an etching depth is controlled on the basis of the equivalent refractive index difference between the second waveguide 42 and the second recesses 44 therearound.

Next, the first region 30 (first waveguide 32 and first recesses 34) of the waveguide structure 50 is formed. For example, the first region 30 is formed by the steps of photolithography and etching. In the etching step, dry etching is performed so as not to exceed the etching-stop layer 131a. Also, in the etching step, the semiconductor layer remaining on the etching-stop layer 131a is removed by wet etching with ammonia hydrogen peroxide water or the like. Thus, the first region 30 is formed.

Next, the dielectric layer 25 (see FIGS. 3A and 3B) is formed. Specifically, the dielectric layer 25 is formed on the ridge excluding the top of the ridge by a film-forming technique and photolithography. The dielectric layer 25 is formed to cover the wall face of the ridge and the inner faces of the first recesses 34 and the second recesses 44.

The material of the dielectric layer 25 is $SiO_2$, for example. The material of the dielectric layer 25 may be Si, SiN, $Al_2O_3$, $Ta_2O_5$, AlN, or the like. The film of the dielectric layer 25 may be a single layer film or a multi-layer film. The thickness of the dielectric layer 25 is not limited as long as the first recesses 34 and the second recesses 44 are protected.

Figure 7B:
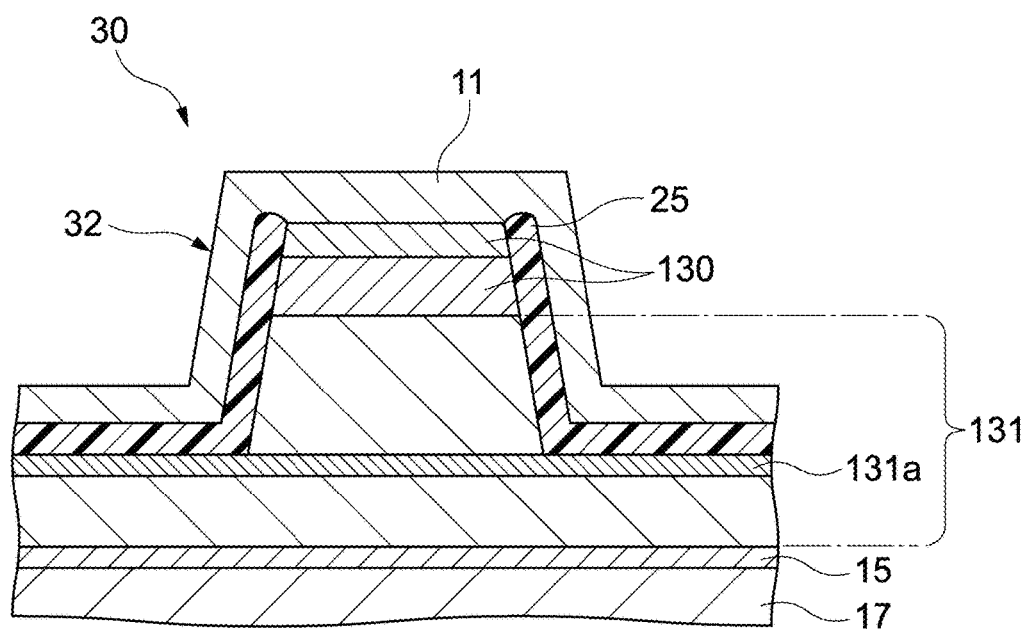
FIG. 7B is a cross-sectional view showing a cross section of a first region of a device on which a first electrode layer is formed after a dielectric layer is formed.

FIG. 7B is a cross-sectional view showing the cross section of the first region 30 of the device on which the first electrode layer 11 is formed after the dielectric layer 25 is formed. The first electrode layer 11 is formed by a film-forming technique and photolithography. The first electrode layer 11 is formed at least on the top of the ridge but may be formed continuously on the wall face and the like of the ridge, as shown in FIG. 7B. The materials of the first electrode layer 11 are Ti/Pt/Au from a semiconductor side, for example.

Note that, as shown in FIGS. 3A and 3B, the shape of the cross section (cross section of z-x plane) of the ridge is a rectangle. However, in fact, the shape is a trapezoid, in which the width of the upper contact layer is narrower, for example, as shown in FIG. 7B. As a matter of course, the cross section of the ridge may be a rectangle or an inverted trapezoid (trapezoid upside down).

The wafer, i.e., the GaAs substrate (substrate 19), is abraded and thinned to a predetermined thickness and the second electrode layer 12 is formed on the back surface of the wafer (see FIG. 1). The second electrode layer 12 includes, for example, AuGe/Ni/Au from the semiconductor side.

After the second electrode layer 12 is formed, the wafer is worked by, for example, cleavage and is formed into a chip for a unit of a light-emitting device. Thus, the light-outgoing end face 101a of the light-emitting device 100 is formed. On the light-outgoing end face 101a, the dielectric film 21 is formed for the purpose of protecting and decreasing the reflectance. The dielectric film 21 is formed by, for example, sputtering or deposition. Examples of the materials of the dielectric film 21 include $SiO_2$, $Al_2O_3$, $Ta_2O_5$, $TiO_2$, and the like.

In order to decrease the coefficient of coupling for the waveguide, the reflectance of the light-outgoing end 101 is set to 0.3% or less. On the other hand, the reflectance of the rear end 102 is set to approximately 95% or more. The reflectances of the light-outgoing end 101 and the rear end 102 are not limited to the above-described numerical values. A lower reflectance may be set on the light-outgoing end 101 and a higher reflectance may be set on the rear end 102.

The chip produced as described above is mounted on a package used in an LD (Laser Diode) or another predetermined jig. A solder material for mounting is, for example, an AuSn alloy, Sn, silver paste, or the like. The chip may be mounted on any of a p side and an n side of the semiconductor device as a package side. In order to efficiently exhaust heat, the chip is desirably mounted on the p side as the package side.

The mounted light-emitting device 100 is connected to a terminal for power feeding via an Au wire bond. As necessary, components for protecting the light-emitting device 100 are mounted, and the product is thus manufactured.

Figure 8:
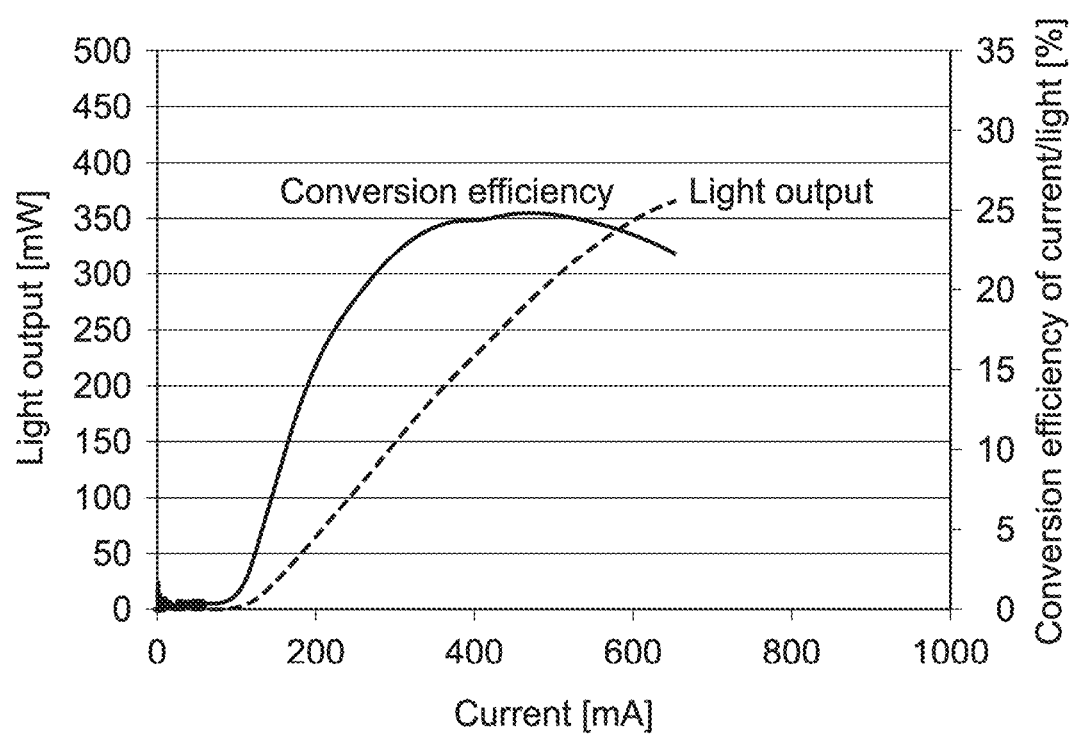
FIG. 8 is a graph showing light output properties of the red SLD.

FIG. 8 is a graph showing light output properties of the light-emitting device 100 manufactured as described above. Specifically, the graph shows a relationship among a current, a light output, and current-to-light conversion efficiency.

The spot size is 1.17 mm in one direction (for example, a horizontal direction) and 0.71 mm in a direction orthogonal thereto.

It is confirmed that the light-emitting device 100 manufactured as described above has a high output light having about 400 mW at room temperature and the spot size of 1.17 µm. In other words, it is revealed that both of small spot size and high output can be provided.

Note that the size of the light-emitting device 100 manufactured is as follows:
L1=990 µm
L2=1000 µm
L3=2200 µm
W1=7 µm
W2=6 µm
W3=3.4 µm 1.3.2) Method of Producing Green SLD and Blue SLD Next, a method of producing a green SLD and a blue SLD will be described. Here, description of the method similar to the method of producing the red SLD will be simplified or omitted and different points will be mainly described.

The method of producing the green SLD and the blue SLD is different from the method of producing the red in that no etching-stop layer 131a is arranged. The etching depth is controlled on a basis of time. As the semiconductor material of the green SLD, a GaN based material is used. In this case, since wet etching may not often be performed, no etching-stop layer 131a is provided.

Other than the above, there may be used a method of detecting an etching stop position by irradiating a crystal multi-layer structure with laser by utilizing the fact that difference of the film thickness of the multi-layer structure before and after etching periodically changes the reflectance of laser light.

The respective layers of the semiconductor layers are formed of, for example, the following materials.
Substrate: GaN
Active layer: INGaN
Guide layer: GaN or INGaN
Clad layer: InAlGaN or AlGaN
Contact layer: GaN or AlGaN The structure and the method of producing the LD disclosed in, for example, Japanese Patent Application Laid-open No. 2012-174868 are suitable as the structure and the method of producing the "first region 30" of the green SLD. The structure and the method of producing the LD disclosed in, for example, Japanese Patent Application Laid-open No. 2010-129763 are suitable as the structure and the method of producing the blue SLD.

Note that the green SLD and the blue SLD are distinguished by a difference of doped impurities and a difference of the amount thereof.

2. Second Region According to Other Embodiments

In the following description, other embodiments of the second region 40 of the waveguide structure 50 of the light-emitting device 100 will be described. In the description below, the components of the light-emitting device 100 according to the embodiment are denoted by the same reference signs, and description thereof will be omitted or simplified and different points will be mainly described.

Similar to the SLD of the light-emitting device 100, all waveguides (all waveguides including the first waveguide 32 and the second waveguide 42) of the light-emitting device 100 are nonlinear commonly in the second regions of FIGS. 9 to 14.

2.1) Other Embodiment 1

Figure 9:
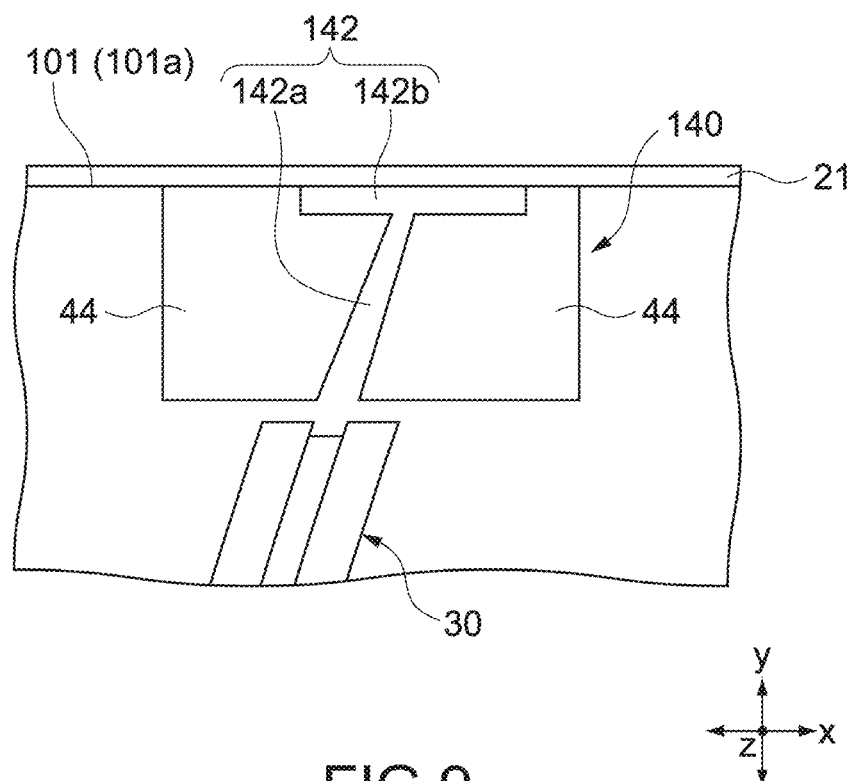
FIG. 9 is a plan view mainly showing a second region according to another embodiment 1.

FIG. 9 is a plan view mainly showing a second region 140 according to another embodiment 1. A waveguide (second waveguide 142) of the second region 140 includes a main region 142*a* and an enlarged region 142*b*. The width of the main region 142*a* is narrowed toward the light-outgoing end 101. The enlarged region 142*b* is arranged at the light-outgoing end 101 so as to extend from the minimum width of the main region 142*a*.

The width of the enlarged region 142*b* (width in the direction in parallel with the light-outgoing end face 101*a*, i.e., width in the x direction) is wider than the width at any position of the second region 140. Also, the width is set smaller than, for example, the width of the recess (second recess 44) of the second region 140.

The length of the enlarged region 142*b* in the y direction is greater than the thickness of the dielectric film 21, for example. The enlarged region 142*b* may have the length substantially the same as the thickness (length in the y direction) of a window region (not shown) or may have the length close thereto (length in the y direction), for example.

The light-emitting device 100 having the above-described structure can provide the effects similar to the effects of the light-emitting device 100, even if the second region 140 includes the enlarged region 142*b*.

Figure 10:
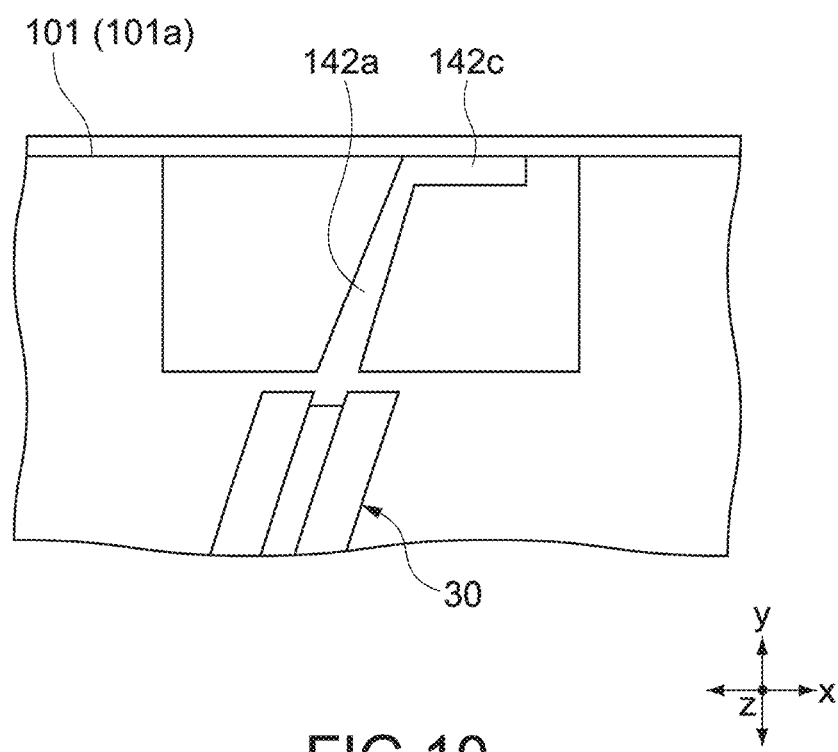
FIG. 10 is a plan view mainly showing a second region according to the other embodiment 1.

The enlarged region 142*c* may be arranged so as to extend to only one side of the direction along the light-outgoing end face 101*a* (i.e., x direction) from the center main region 142*a*, as shown in FIG. 10.

2.2) Other Embodiment 2

Figure 11:
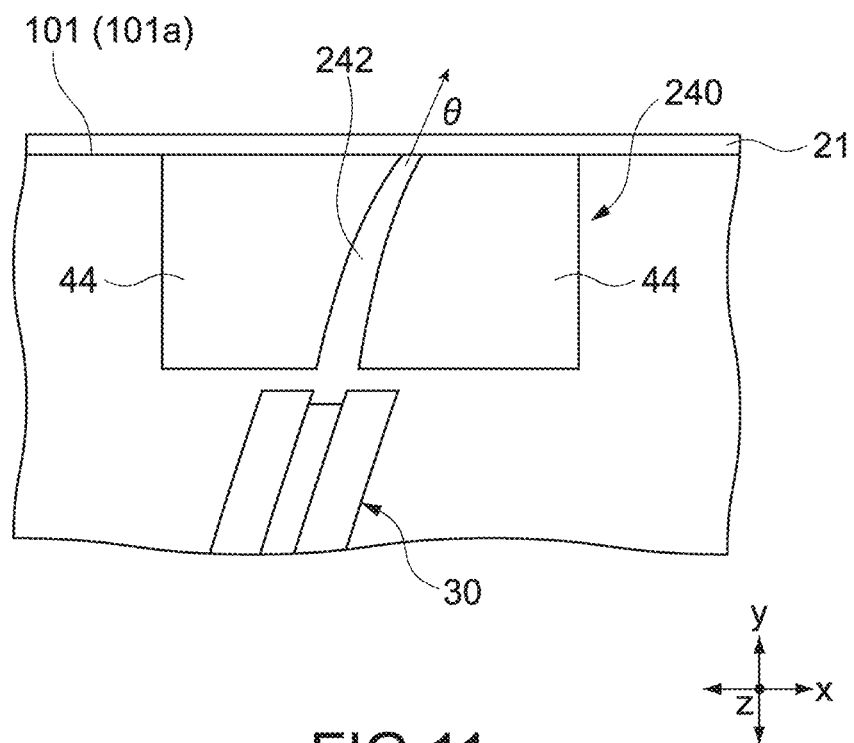
FIG. 11 is a plan view mainly showing a second region according to another embodiment 2.

FIG. 11 is a plan view mainly showing the second region according to another embodiment 2. The waveguide (second waveguide 242) of the second region 240 according to the other embodiment 2 includes the waveguide arranged in a curve (curved waveguide, nonlinear waveguide) along the longitudinal direction of the waveguide. In addition, the second waveguide 242 is arranged at the light-outgoing end 101 such that the second waveguide 242 is crossed at the angle of θ to the light-outgoing end face 101*a*. In other words, the curve along the curved waveguide and the tangential line of the curve at the intersection point of the light-outgoing end face 101*a* form the angle of θ.

The second waveguide 242 having the above-described structure may include the enlarged region 142*b* or 142*c* shown in FIG. 9 or 10. The same applies to the following embodiment 3 or later.

2.3) Other Embodiment 3

Figure 12:
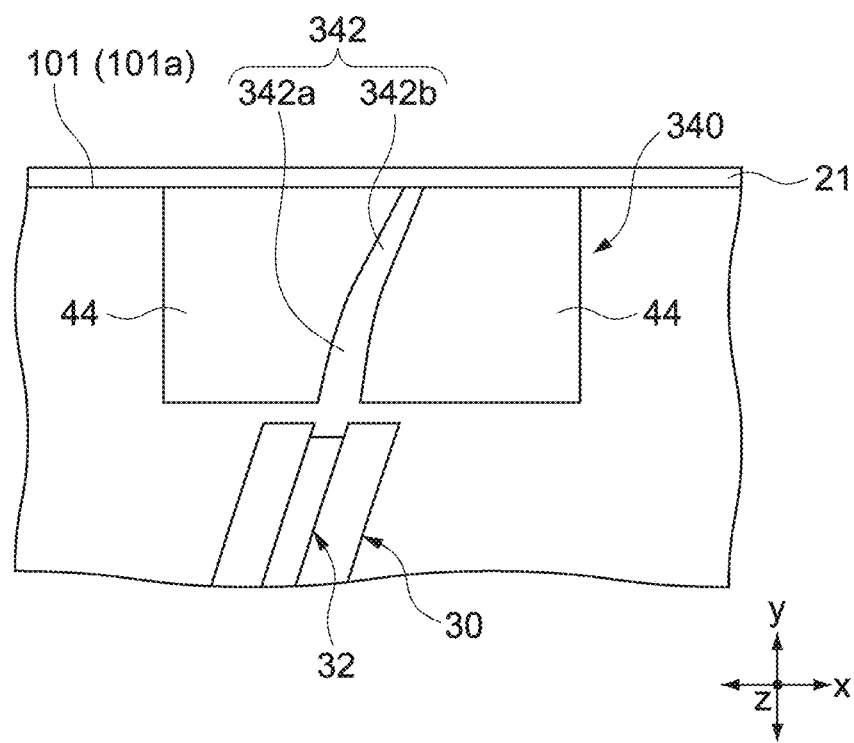
FIG. 12 is a plan view mainly showing a second region according to another embodiment 3.

FIG. 12 is a plan view mainly showing the second region according to another embodiment 3. The waveguide (second waveguide) 342 of the second region 240 according to the other embodiment 3 includes a curve waveguide 342*a* arranged in a curve extended from the first waveguide 32 of the first region 30 and a linear waveguide 342*b* extended from the curve waveguide 342*a*. The "curve" includes an arc, a quadratic curve, or a concept of combining them. The same applies hereinafter.

A straight line along the longitudinal direction of the linear waveguide 342*a* is arranged at the angle of θ toward the light-outgoing end face 101*a* (for example, see FIG. 4).

In another embodiment, the arrangement of the curved waveguide 342*a* and the linear waveguide 342*b* may be reversed. Specifically, the linear waveguide may be extended from the first waveguide 32 and the curved waveguide may be extended from the linear waveguide.

2.4) Other Embodiment 4

Figure 13:
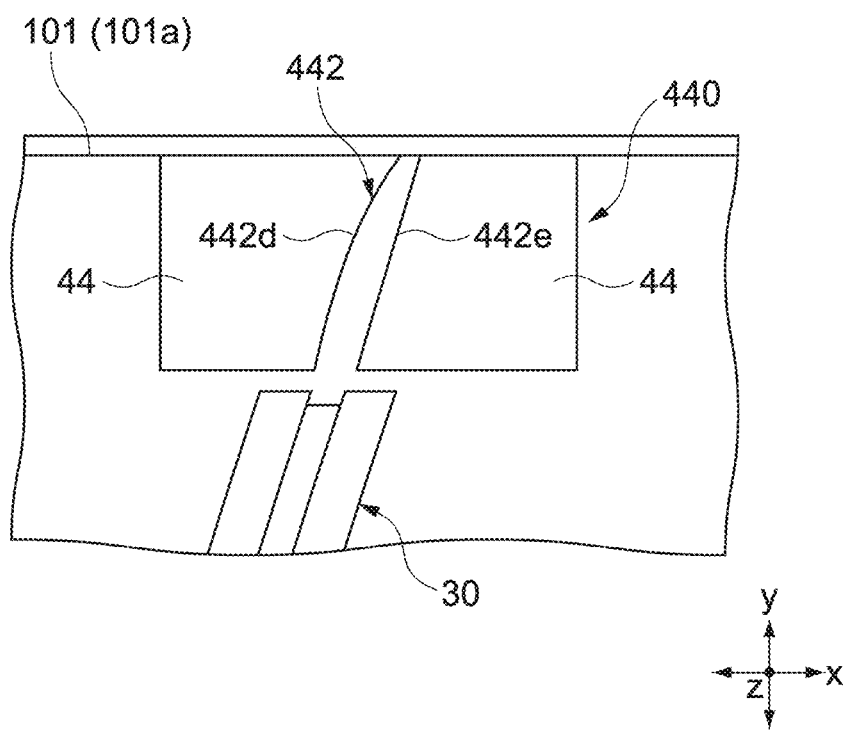
FIG. 13 is a plan view mainly showing a second region according to another embodiment 4.

FIG. 13 is a plan view mainly showing the second region according to another embodiment 4. A second region 440 according to the other embodiment 4 has a curved surface of one wall face 442*d* (wall face at a ridge side of the second region 440) and a flat surface of the other wall face 442*e* face thereto of the waveguide (second waveguide 442).

A straight line along the flat surface of the wall face 442*e* is arranged at the angle of θ toward the light-outgoing end face 101*a* (for example, see FIG. 4).

2.5) Other Embodiment 5

Figure 14:
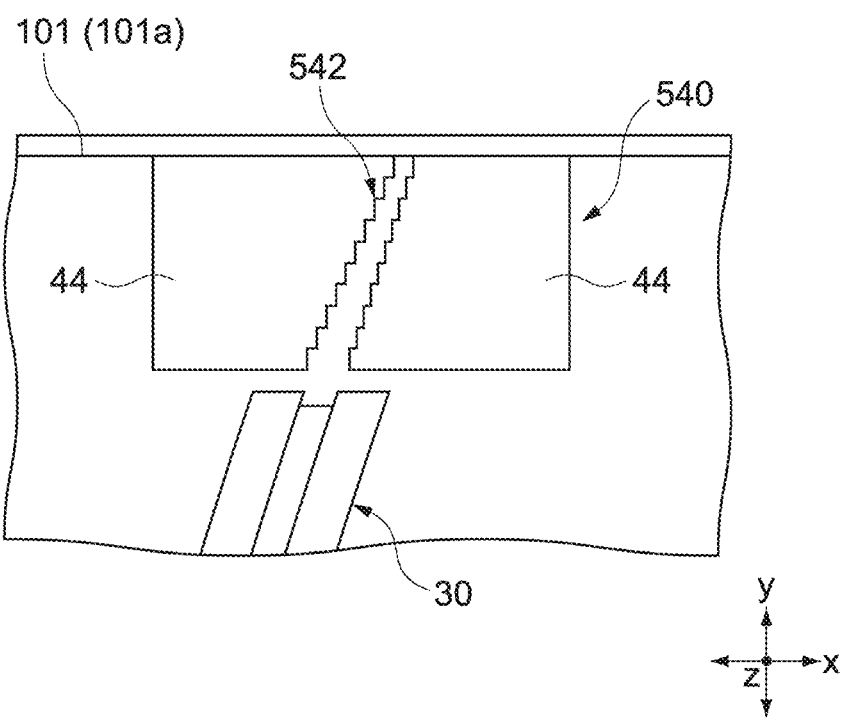
FIG. 14 is a plan view mainly showing a second region according to another embodiment 5.

FIG. 14 is a plan view mainly showing the second region according to another embodiment 5. The waveguide (second waveguide) 542 of the second region 540 according to the other embodiment 5 includes a step-wise wall face and is a nonlinear waveguide. The step-wise wall face allows the structure that the straight line along the longitudinal direction of the second waveguide 542 is arranged at the angle of θ toward the light-outgoing end face 101*a* (for example, see FIG. 4).

3. First Region According to Other Embodiments

The laser scanning type projector currently needs a light source having high brightness and low speckles. In particular, the SLD having a wide spectrum width is suitable and expected for the application. However, in the conventional SLD structure, a large amount of current is injected to the region of the waveguide close to the rear end 102 side, the stimulated emission has a low efficiency, and the light output is limited. In order to solve the problems, the present inventors propose a light-emitting device having a waveguide structure including a first region described below.

3.1) Other Embodiment 1

Figure 15:
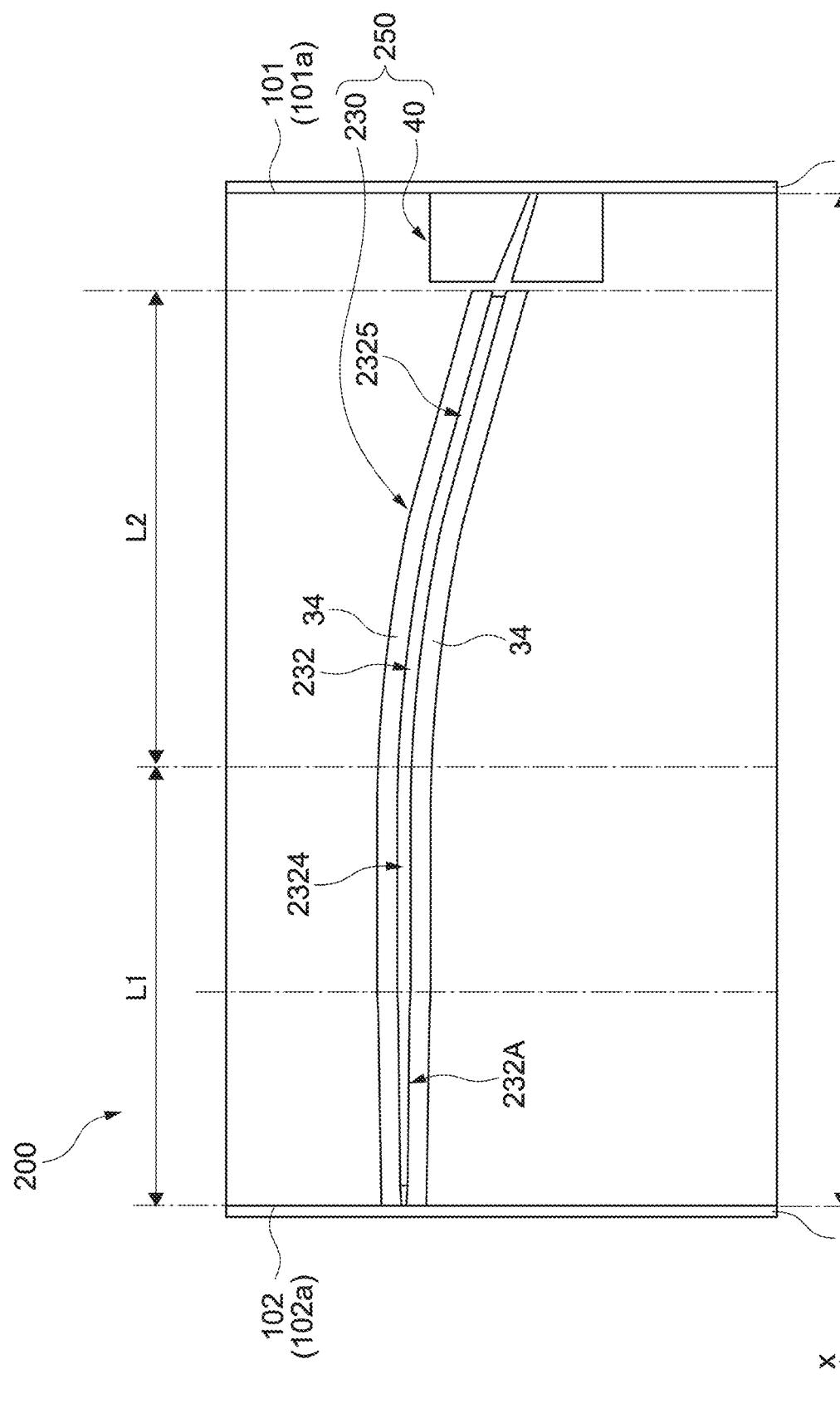
FIG. 15 is a plan view showing a light-emitting device having a first region according to the other embodiment 1.
Figure 16:
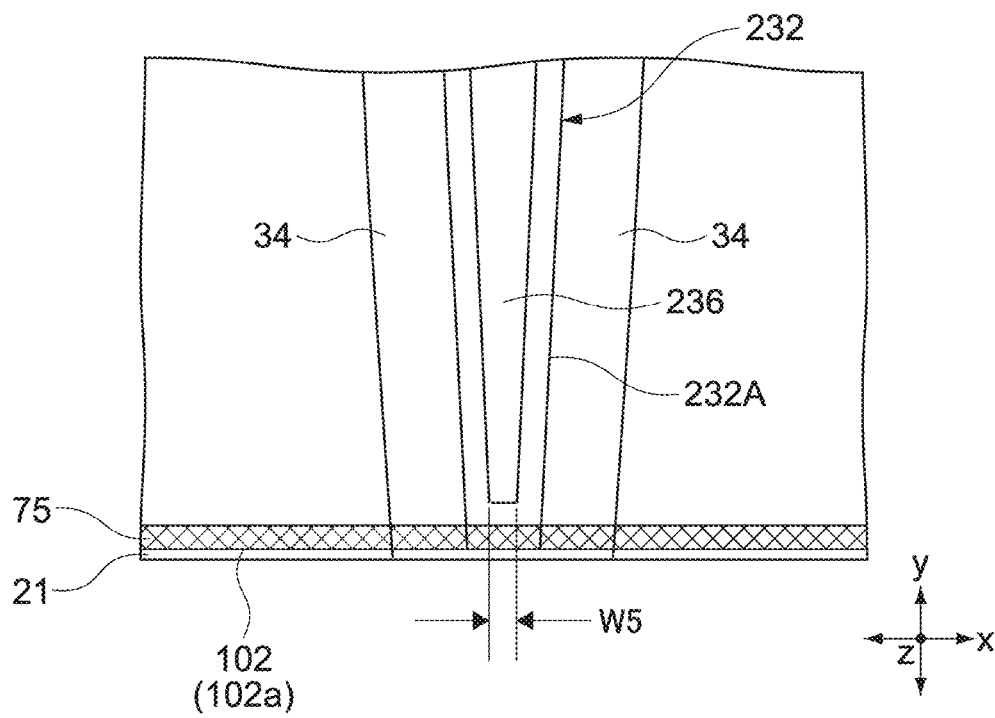
FIG. 16 is an enlarged plan view around the first region of the light-emitting device shown in FIG. 15.

In the following description, another embodiment of the first region 30 of the waveguide structure 250 of the light-emitting device 100 shown in FIGS. 1, 2, and the like will be described. FIG. 15 is a plan view showing a light-emitting device having the first region according to the other embodiment 1. FIG. 16 is an enlarged plan view around a first region 230 of the light-emitting device 200 shown in FIG. 15. Note that no first electrode layer is shown and a contact layer 236 under the first electrode layer is shown as an uppermost layer of FIG. 16.

In the light-emitting device 100 shown in FIGS. 1, 2, and the like, the width of the waveguide (first waveguide 32) of the first region 30 of the waveguide structure 50 is substantially uniform. However, the first waveguide 232 according to this embodiment includes a region where the width is narrowed toward the rear end 102 shown in FIGS. 15 and 16. In other words, the ridge of the first waveguide 232 has a tapered wall face. Hereinafter, the waveguide of the region is referred to as a "tapered waveguide", for convenience of description, and is denoted by a reference symbol 232A.

The first waveguide 232 of the first region 230 includes a linear waveguide 2324 and a curved waveguide 2325 extended from the linear waveguide 2324 similar to the first waveguide 32 of FIG. 1. The tapered waveguide 232A is provided on the linear waveguide 2324. The longitudinal direction of the linear waveguide 2324 is the longitudinal direction (y direction) of the light-emitting device 200 and is orthogonal to the rear end face 102a so that more spontaneous emission light, i.e., seed light, is reflected by the linear waveguide 2324. The longitudinal direction of the linear waveguide 2324 is not limited to the longitudinal direction but may be oblique.

The tapered waveguide 232A is continuously arranged from the rear end 102 in the y direction and has a predetermined length smaller than ½ of the total length L0 (region having length of about L1 from the rear end 102). Typically, the length of the tapered waveguide 232A from the rear end 102 is about ¼ of L0, as shown in FIG. 15.

The position of the rear end of the tapered waveguide 232A is desirably aligned with or closer to the rear end 102 of the light-emitting device 200, specifically, the rear end 102 of the semiconductor device excluding the dielectric film 21. Specifically, the length of the tapered waveguide 232A is ½ of L0 at the maximum length.

A width W5 of rear end of the tapered waveguide 232A (see FIG. 19), i.e., the narrowest width W5 is set, for example, to from 2 μm and 5 μm or less, typically to 2.38 μm.

Note that in this embodiment, corresponding to the shape of the tapered waveguide 232A, side wall faces of the recesses (first recesses 34) that sandwich the tapered waveguide 232A at both ends are also tapered. However, the wall faces of the first recesses 34 may not necessarily be tapered.

Also, in this embodiment, as shown in FIG. 16, the rear end of the contact layer 236 is arranged at the position that does not interfere with a window region 75 arranged at the rear end 102 of the light-emitting device 200 (semiconductor device). For example, the rear end of the contact layer 236 is arranged apart from the rear end 102 of the light-emitting device 200 by 45 nm. In a case where no window region 75 is formed, such limitation is unnecessary.

Thus, by arranging the tapered waveguide 232A at a rear end side of the first waveguide 232, the light-emitting device 200 functions as follows: The LD emits light by a mechanism that while light goes to and fro between parallel mirrors, induced emission light is amplified. On the other hand, the SLD emits light by a mechanism that the spontaneous emission light, i.e., seed light, is generated at the rear end 102 and close to the rear end 102 and is amplified and emitted during transmitting to the light-outgoing end 101. A light emission principle of the SLD is different from that of the LD. In addition, the waveguide structures 50 and 250 of the SLD have a major feature that the region (light amplifying region) close to the light-outgoing end 101 than the rear end 102 has a role contributing to the light emission different from that of the region (LED region) close to the rear end 102 than the light-outgoing end 101, as described above.

In other words, injecting more current into the light amplifying region than the LED region contributes to high-output. Since a surface area of the current injection in the LED region is set smaller than that in the current injection region, the tapered waveguide 232A can be arranged to provide high-output. In addition, the angle of the tapered wall face is such that the spontaneous emission light generated at the tapered waveguide 232A is easily reflected to a light-outgoing end 101 side, which also contributes to high-output.

Figure 17:
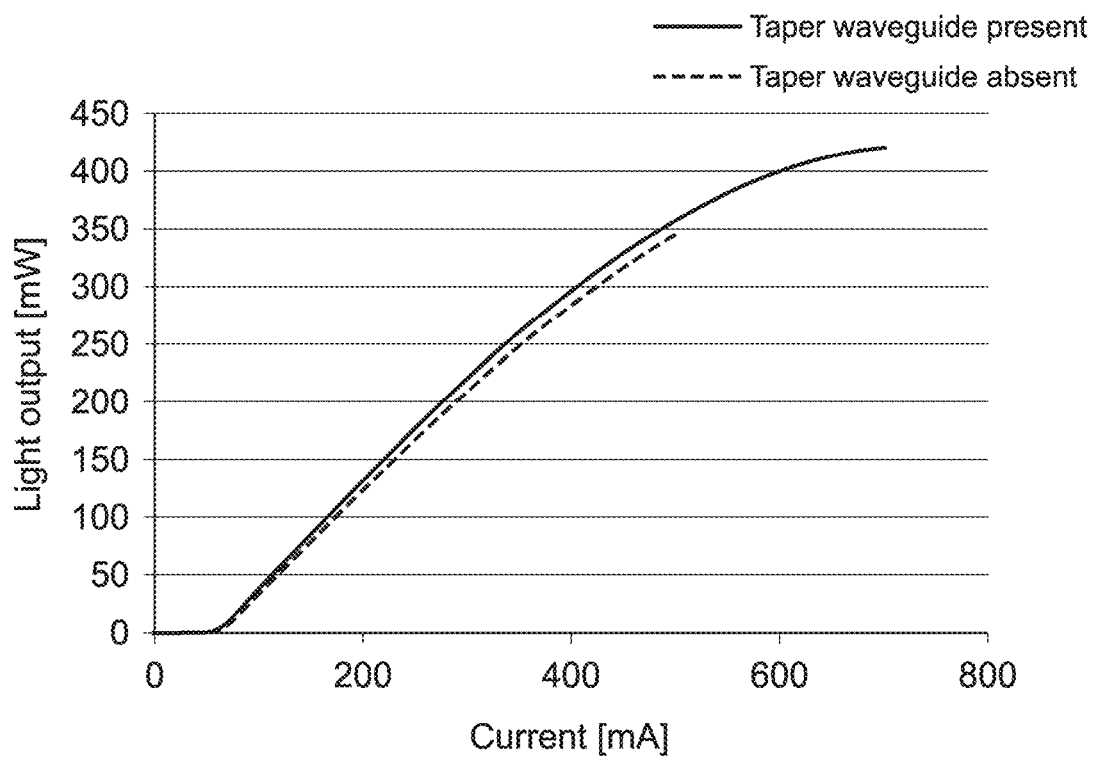
FIG. 17 is a graph showing light output properties of the light-emitting device shown in FIG. 15.

FIG. 17 is a graph showing light output properties (relationship between current and light output) of the light-emitting device 200 according to this embodiment. A dashed line represents that no tapered wave guide 232A is arranged (waveguide having ridge where both wall faces are in parallel) and a solid line represents that the tapered waveguide 232A is arranged according to this embodiment. The graph reveals the tendency of an improvement on the light output.

Figure 18:
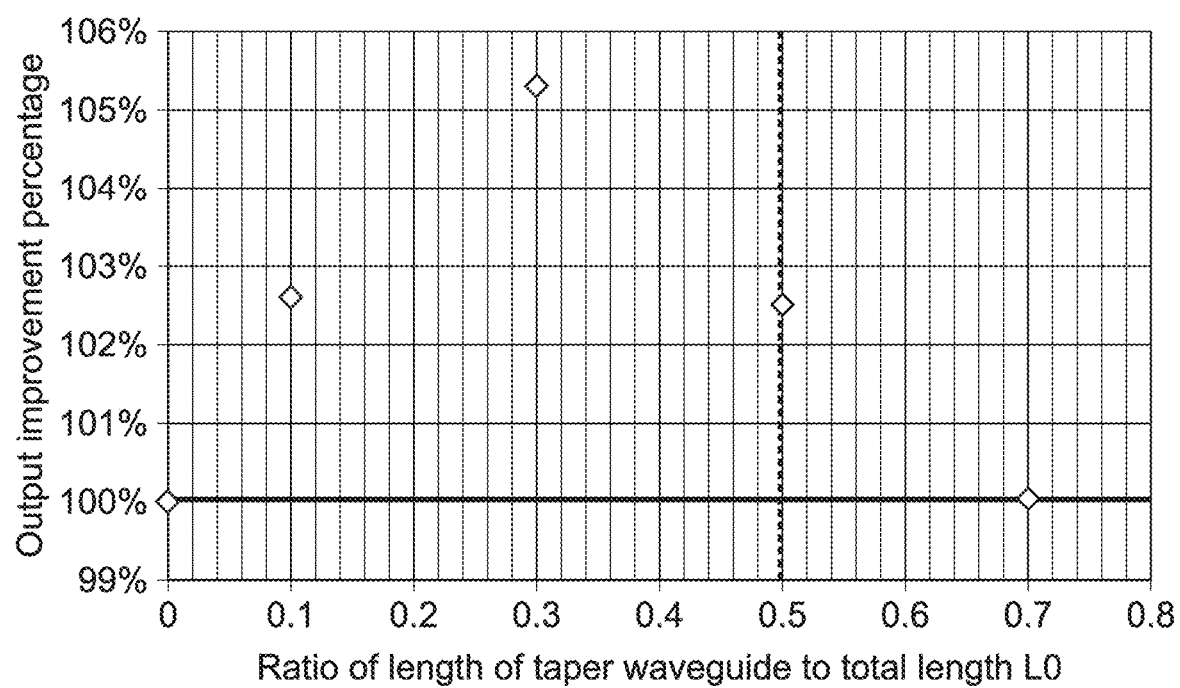
FIG. 18 is a graph showing a relationship between a length of a tapered waveguide and an output improvement percentage.

The functions and effects provided by the tapered waveguide 232A change depending on the length of the tapered waveguide 232A. FIG. 18 is a graph showing a relationship between the length of the tapered waveguide 232A and an output improvement percentage. In the vertical axis of the graph, the output of the light-emitting device 200 having no tapered waveguide 232A (having parallel waveguide) is set to 100%. In addition, the length of the tapered waveguide 232A in the horizontal axis is shown by the ratio to the total length L0.

FIG. 18 reveals the tendency of high-output as the tapered waveguide 232A is longer up to about 30% of the total length L0 of the tapered waveguide 232A. Where the length of the tapered waveguide 232A reaches 70% of the total length L0, the waveguide is substantially similar to the parallel waveguide and no improvement effect is provided. From the result, the length of the tapered waveguide 232A from the rear end 102 is set to about ½, more preferably about ⅓ of the total length L0.

3.2) Other Embodiment 2

Figure 19:
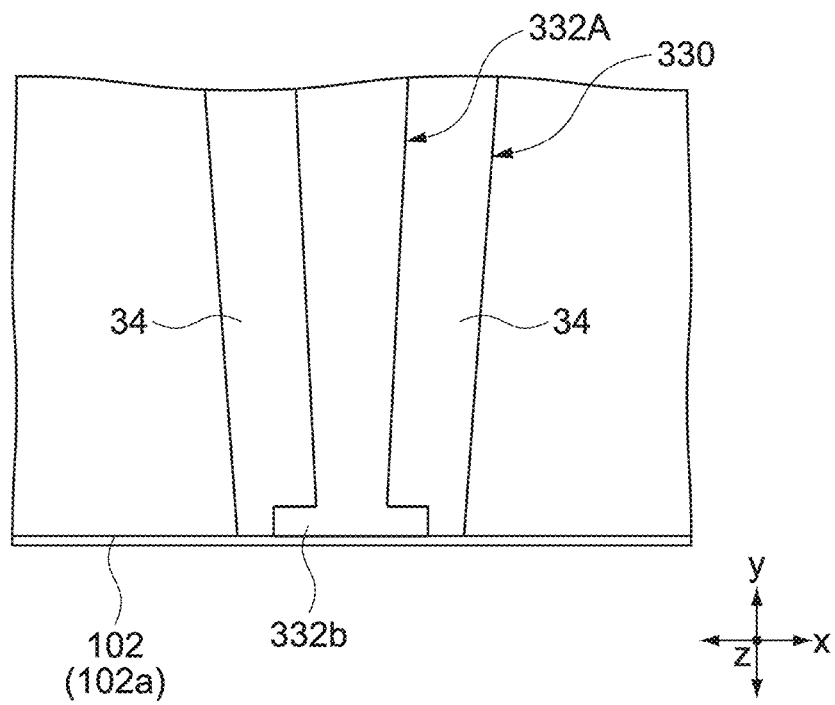
FIG. 19 is a plan view showing the other embodiment 2 of (the tapered waveguide in) the first region.

FIG. 19 is a plan view showing the other embodiment 2 of (the tapered waveguide in) the first region. The first waveguide 332 of the first region 330 includes a wide enlarged region 332b arranged in a region having a predetermined length from the rear end 102 to the tapered waveguide 332A in the y direction. According to this structure, the effects similar to those of the light-emitting device 100 having the first region 30 according to the other embodiment 1 are also provided.

The enlarged region 332b is arranged so as to extend from the center of the tapered waveguide 332A in the x direction toward both sides. The enlarged region according to this embodiment may be arranged to extend to only one side from the center similar to the enlarged region 142b shown in FIG. 10.

3.3) Other Embodiment 3

Figure 20:
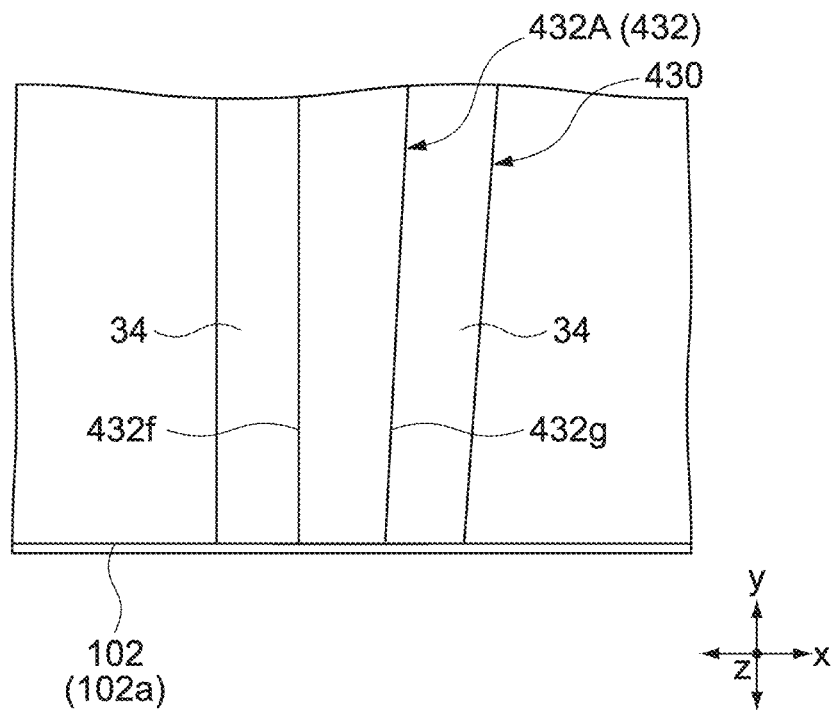
FIG. 20 is a plan view showing the other embodiment 3 of (the tapered waveguide of) the first region.

FIG. 20 is a plan view showing another embodiment 3 of (the tapered waveguide of) the first region. In the first waveguide 432 of the first region 430, one of the wall faces 432f and 432g, i.e., only the wall face 432g, of the ridge of the tapered waveguide 432A is tapered. The other wall face 432f is arranged orthogonal to the rear end 102.

3.4) Other Embodiment 4

In another embodiment 4 of the first region, the curved waveguide 2325 having the length L2 of FIG. 15 may be replaced with a linear waveguide (not shown) that forms the angle θ with the light-outgoing end face 101a, for example.

3.5) Other Embodiment 5

Alternatively, in another embodiment 5, the curved waveguide 2325 having the length L2 in FIG. 15 may be replaced with the combination of a linear waveguide and a curved waveguide (not shown), for example.

In this case, a curved waveguide extended from the linear waveguide 2324 closer to the rear end 102 to the light-outgoing end 101 and a linear waveguide extended from the curved waveguide to the light-outgoing end 101 may be arranged, for example. According to this structure, even though light leaks from the curved waveguide, since the curved waveguide is apart from the light-outgoing end 101, light emitting to the outside of the light-emitting device can be suppressed. As a result, a good beam spot can be formed. In particular, as the leakage light has an adverse effect on the shape of the beam spot, it is important to suppress the leakage of light in a case where the light-emitting device is used as a light source of a projector.

Note that the above-described other embodiments 4 and 5 (not shown) of the first region may not be combined with the above-described other embodiments 1 to 3 and may have no tapered waveguide.

3.6) Other Embodiment 6

In another embodiment 6, any one of the above-described other embodiments 1 to 5 of the first region may be combined with any one of the above-described respective embodiments of the second region to form the light-emitting device (not shown).

4. Display Apparatus

Figure 21:
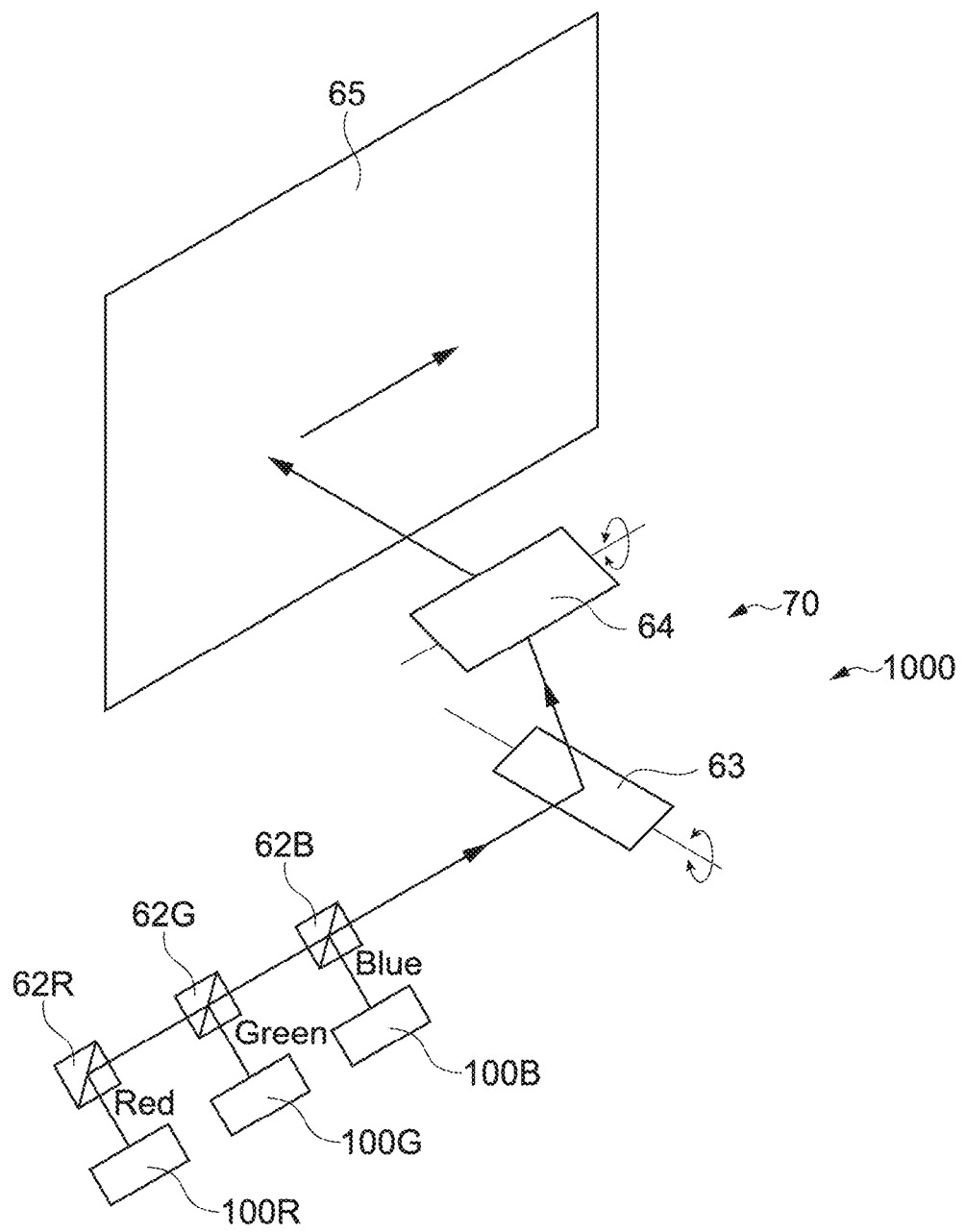
FIG. 21 is a view schematically showing a display apparatus using any of SLDs, i.e., light-emitting devices, according to the above-described respective embodiments as the light source.

FIG. 21 schematically shows a display apparatus using any of the SLDs, i.e., light-emitting devices, according to the above-described respective embodiments as the light source. A display apparatus 1000 is a projector of a raster scan type.

The display apparatus 1000 includes an image generation unit 70. The image generation unit 70 is configured to be capable of two-dimensionally scanning, e.g., raster-scanning, the light emitted from the light-emitting device as the light source and controlling brightness of the light projected on a projection surface 65 such as a screen and a wall face on the basis of image data.

The image generation unit 70 mainly includes a horizontal scanner 63 and a vertical scanner 64, for example. Respective beams from an SLD 100R emitting red light, an SLD 100G emitting green light, and an SLD 100B emitting blue light are gathered by dichroic prisms 62R, 62G, and 62B into one beam. The beam is scanned by the horizontal scanner 63 and the vertical scanner 64 and is projected on the projection surface 65. As a result, an image is displayed.

Note that, among the light-emitting devices that emit respective colors of RGB, at least one of them may be the SLD and the other devices may be general LDs.

Each of the horizontal scanner 63 and the vertical scanner 64 is formed, for example, of a combination of a polygon mirror and a galvano scanner. In this case, as a brightness control means, a circuit of controlling a current injected into the light-emitting device, for example, is used.

Alternatively, as each of the horizontal scanner and the vertical scanner, a two-dimensional light modulator such as, for example, a DMD (Digital Micro-mirror Device) produced by using an MEMS (Micro Electro Mechanical System) technique may be used.

Alternatively, the image generation unit 70 may include a combination of a one-dimensional light modulator such as a GLV (Grating Light Valve) device and the above-described one-dimensional scan mirror.

Alternatively, the image generation unit 70 may include a refractive index modulation type scanner such as an acousto-optical effect scanner and an electro-optical effect scanner.

5. Other Various Embodiments

The embodiments of the present technology are not limited to the above-described embodiments, and other various embodiments may be available.

For example, in the embodiment described with reference to FIG. 1, the second recesses 44 of the second region 40 of the waveguide structure 50 are deeper than the active layer 15. However, the second recesses 44 may not necessarily reach the active layer 15 with respect to the depth (depth positions of the bottom faces 44a of the second recesses 44), for example. The spirit of the present technology is that it is important that the second refractive index difference of the second region 40 is greater than the first refractive index difference of the first region 30. The refractive index difference is a feature that promotes the light confinement effect of the second region 40. The same applies to the other embodiments.

Accordingly, the first region 30 may not include the first recesses 34 arranged in the first conduction type layer 13, for example. For example, the first region 30 according to the present technology may include a current block region (i.e., current non-injection region) of the second conduction type layer 17 arranged around the first waveguide 32 as disclosed in Japanese Patent Application Laid-open No. 2005-12044. The same applies to the other embodiments.

The SLD, i.e., the light-emitting device according to each of the above-described embodiments has the light-outgoing end 101 and the rear end 102 opposite thereto. However, both ends of the light-emitting device (not limited to the SLD) may be light-outgoing ends. In this case, as the waveguide structure, the second region having the second refractive index difference in the second region greater than the first refractive index difference in the first region is arranged at each of both ends (light-outgoing ends) of the light-emitting device.

As the light-emitting device according to each embodiment, the SLD is taken as an example but an LD (Laser Diode) may be used. Where the LD is used, the respective waveguides of the first region and the second region of the waveguide structure are arranged on a straight line and the longitudinal direction of the waveguides is desirably orthogonal to the light-outgoing end face 101a. Where the light-emitting device is the SLD, the first waveguide of the first region may be arranged nonlinearly (for example, on a curved line) in the whole longitudinal direction.

In the embodiments, the first conduction type is set to a p type and the second conduction type is set to an n type. Alternatively, the first conduction type may be set to an n type and the second conduction type may be set to a p type.

It is possible to combine at least two features of the respective embodiments described above.

The present technology may also have the following structures.

(1) A light-emitting device including a substrate, a first end being a light-outgoing end, and a second end arranged at a side opposite to the first end, including:
 a stripe-shaped first electrode layer extending from the second end to the first end;
 a first conduction type layer including a current injection region formed by the first electrode layer and a current non-injection region;
 a second conduction type layer arranged on the substrate;
 an active layer arranged between the first conduction type layer and the second conduction type layer; and
 a second electrode layer being in contact with the substrate or the second conduction type layer,
 a waveguide structure included in the first conduction type layer, the active layer, and the second conduction type layer including
  a first region having a first waveguide that is the current injection region and the current non-injection region and having a first refractive index difference between a refractive index of the current injection region and a refractive index of the current non-injection region, and
  a second region arranged between the first region and the first end having a second waveguide arranged to be extended from the first waveguide to the first end and having a second refractive index difference between a refractive index of the second waveguide and a refractive index of a region around the second waveguide in the second region, the second refractive index difference being greater than the first refractive index difference,
   the second waveguide having a region narrowing toward the first end.
(2) The light-emitting device according to (1), in which
 the first region of the waveguide structure has first recesses arranged to sandwich the first waveguide as the current non-injection region, and
 the second region of the waveguide structure has second recesses arranged to sandwich the second waveguide as the region around the second waveguide, the second recesses being deeper than the first recesses.
(3) The light-emitting device according to (2), in which
 the second recesses include bottom faces arranged at a position deeper than a position of the active layer.
(4) The light-emitting device according to (2) or (3), further including:
 a dielectric layer covering the second recesses.
(5) The light-emitting device according to any one of (1) to (4), in which
 a first width being an end width of a first region side of the second waveguide is wider than a second width being an end width of a second region side of the first waveguide.
(6) The light-emitting device according to (5), in which
 a third width being a width at the first end of the second waveguide is narrower than the second width.
(7) The light-emitting device according to any one of (1) to (6), in which
 the second waveguide includes a linear waveguide linearly arranged along the longitudinal direction of the second waveguide.
(8) The light-emitting device according to (7), in which
 the linear waveguide is extended to the first end, and
 a linear direction along the longitudinal direction of the linear waveguide is not orthogonal to an end face of the first end.
(9) The light-emitting device according to (7) or (8), in which
 the second waveguide further includes a nonlinear waveguide nonlinearly arranged and extended from the linear waveguide.
(10) The light-emitting device according to any of (1) to (6), in which
 the second waveguide includes a nonlinear waveguide nonlinearly arranged.
(11) The light-emitting device according to (10), in which
 the nonlinear waveguide is not orthogonal to an end face of the first end in the direction along the longitudinal direction of the nonlinear waveguide at the first end.
(12) The light-emitting device according to any one of (1) to (11), in which
 the first waveguide includes at least one of a nonlinear waveguide nonlinearly arranged and a linear waveguide linearly arranged along the longitudinal direction of the first waveguide.
(13) The light-emitting device according to any one of (1) to (12), in which
 the first waveguide includes a tapered waveguide having a narrower width toward the second end in a region from the second end to ½ of the length from the first end to the second end.
(14) The light-emitting device according to (13), in which
 the tapered waveguide has the narrowest width at the second end.
(15) The light-emitting device according to (13) or (14), in which
 a linear direction along the longitudinal direction of the tapered waveguide is orthogonal to the second end face.
(16) A display apparatus, including:
 a light-emitting device including a substrate, a first end being a light-outgoing end, and a second end arranged at a side opposite to the first end; and
 an image generation unit capable of two-dimensionally scanning light outgoing from the light-emitting device and controlling brightness of projected light on the basis of image data,
 the light-emitting device including
  a stripe-shaped first electrode layer extending from the second end to the first end;
  a first conduction type layer including a current injection region formed by the first electrode layer and a current non-injection region;
  a second conduction type layer arranged on the substrate;
  an active layer arranged between the first conduction type layer and the second conduction type layer; and
  a second electrode layer being in contact with the substrate or the second conduction type layer,
  the first conduction type layer, the active layer, and the second conduction type layer including a waveguide structure, the waveguide structure including
   a first region having a first waveguide that is the current injection region and the current non-injection region and having a first refractive index difference between a refractive index of the current injection region and a refractive index of the current non-injection region, and
   a second region arranged between the first region and the first end having a second waveguide arranged to be extended from the first waveguide to the first end and having a second refractive index difference between a refractive index of the second waveguide and a refractive index of a region around the second waveguide in the second region, the second refractive index difference being greater than the first refractive index difference, the second waveguide having a region narrowing toward the first end.

REFERENCE SIGNS LIST 1 first electrode layer
12 second electrode layer
13 first conduction type layer
15 active layer
17 second conduction type layer
19 substrate
30, 230, 330, 430 first region
32, 232, 332, 432 first waveguide
34 first recess
40, 140, 240, 340, 440, 540 second region
42, 142, 242, 342, 442, 542 second waveguide
42b end
44a bottom face
44 second recess
50, 250 waveguide structure
70 image generation unit
100, 200 light-emitting device
101 light-outgoing end
101a light-outgoing end face
102 rear end
102a rear end face
142b, 142c enlarged region
232A, 332A, 432A tapered waveguide
321, 2324 linear waveguide (of first waveguide)
322, 2325 curved waveguide (of first waveguide)
322a end
342a curved waveguide (of second waveguide)
342b linear waveguide (of second waveguide)
1000 display apparatus

The invention claimed is:

1. A light-emitting device, comprising:
a substrate;
a first end as a light-outgoing end;
a second end opposite to the first end;
a stripe-shaped first electrode layer that extends from the second end to the first end;
a first conduction type layer including:
  a current injection region, wherein the stripe-shaped first electrode layer corresponds to the current injection region on the first conduction type layer; and
  a current non-injection region;
a second conduction type layer on the substrate;
an active layer between the first conduction type layer and the second conduction type layer;
a second electrode layer in contact with one of the substrate or the second conduction type layer;
a waveguide structure in the first conduction type layer, the active layer, and the second conduction type layer, wherein the waveguide structure includes:
a first region that includes:
  a first waveguide that corresponds to the current injection region, wherein the stripe-shaped first electrode layer is on a top surface of the first waveguide and a plurality of wall surfaces of the first waveguide; and
  a plurality of first recesses as the current non-injection region, wherein a first refractive index difference of the first region is a difference between a refractive index of the current injection region and a refractive index of the current non-injection region; and
a second region between the first region and the first end, wherein the second region includes:
  a second waveguide that extends from the first waveguide to the first end; and
  a plurality of second recesses, wherein
    the second waveguide is between the plurality of second recesses,
    a second refractive index difference of the second region is a difference between a refractive index of the second waveguide and a refractive index of the plurality of second recesses,
    the second refractive index difference is greater than the first refractive index difference, and
    the second waveguide includes a specific region that narrows toward the first end; and
a dielectric layer in contact with a surface of each recess of the plurality of first recesses and each recess of the plurality of second recesses, wherein
  the dielectric layer is on the plurality of wall surfaces of the first waveguide, and
  the stripe-shaped first electrode layer on the plurality of wall surfaces of the first waveguide is in contact with the dielectric layer on the plurality of wall surfaces of the first waveguide.

2. The light-emitting device according to claim 1, wherein
the first waveguide is between the plurality of first recesses, and
the plurality of second recesses is deeper than the plurality of first recesses.

3. The light-emitting device according to claim 2, wherein the plurality of second recesses includes bottom faces at a position deeper than a position of the active layer.

4. The light-emitting device according to claim 1, wherein a first width that corresponds to an end width of a first region side of the second waveguide is wider than a second width that corresponds to an end width of a second region side of the first waveguide.

5. The light-emitting device according to claim 4, wherein
a third width, that corresponds to an end width of a third region side of the second waveguide, is narrower than the second width, and
the third region side is at the first end.

6. The light-emitting device according to claim 1, wherein the second waveguide includes a linear waveguide linearly arranged along a longitudinal direction of the second waveguide.

7. The light-emitting device according to claim 6, wherein a linear direction of the linear waveguide along the longitudinal direction of the linear waveguide is inclined with respect to an end face of the first end.

8. The light-emitting device according to claim 6, wherein
the second waveguide further includes a nonlinear waveguide nonlinearly arranged in the longitudinal direction of the second waveguide, and
the nonlinear waveguide extends from the linear waveguide.

9. The light-emitting device according to claim 1, wherein the second waveguide includes a nonlinear waveguide nonlinearly arranged in a longitudinal direction of the second waveguide.

10. The light-emitting device according to claim 9, wherein the nonlinear waveguide is inclined with respect to an end face of the first end in the longitudinal direction of the nonlinear waveguide at the first end.

11. The light-emitting device according to claim 1, wherein the first waveguide includes at least one of a nonlinear waveguide nonlinearly arranged along a longitudinal direction of the first waveguide, or a linear waveguide linearly arranged along the longitudinal direction of the first waveguide.

12. The light-emitting device according to claim 1, wherein
the first waveguide includes a tapered waveguide in a region that extends from the second end to half of a total length of the light-emitting device,
a width of the tapered waveguide narrows toward the second end, and
the total length of the light-emitting device is from the first end to the second end.

13. The light-emitting device according to claim 12, wherein a linear direction of the tapered waveguide along a longitudinal direction of the tapered waveguide is orthogonal to an end face of the second end.

14. The light-emitting device according to claim 1, wherein the second electrode layer is in contact with the second conduction type layer.

15. A display apparatus, comprising:
a light-emitting device configured to output light, wherein the light-emitting device includes:
  a substrate;
  a first end as a light-outgoing end;
  a second end opposite to the first end;
  a stripe-shaped first electrode layer that extends from the second end to the first end;
  a first conduction type layer including:
    a current injection region, wherein the stripe-shaped first electrode layer corresponds to the current injection region on the first conduction type layer; and
    a current non-injection region;
  a second conduction type layer on the substrate;
  an active layer between the first conduction type layer and the second conduction type layer;
  a second electrode layer in contact with one of the substrate or the second conduction type layer;
  a waveguide structure in the first conduction type layer, the active layer, and the second conduction type layer, wherein the waveguide structure includes:
    a first region that includes:
      a first waveguide that corresponds to the current injection region, wherein the stripe-shaped first electrode layer is on a top surface of the first waveguide and a plurality of wall surfaces of the first waveguide; and
      a plurality of first recesses as the current non-injection region, wherein a first refractive index difference of the first region is a difference between a refractive index of the current injection region and a refractive index of the current non-injection region; and
    a second region between the first region and the first end, wherein the second region includes:
      a second waveguide that extends from the first waveguide to the first end;
      a plurality of second recesses, wherein
        the second waveguide is between the plurality of second recesses,
        a second refractive index difference of the second region is a difference between a refractive index of the second waveguide and a refractive index of the plurality of second recesses,
        the second refractive index difference is greater than the first refractive index difference, and
        the second waveguide includes a specific region that narrows toward the first end; and
    a dielectric layer in contact with a surface of each recess of the plurality of first recesses and each recess of the plurality of second recesses, wherein
      the dielectric layer is on the plurality of wall surfaces of the first waveguide, and
      the stripe-shaped first electrode layer on the plurality of wall surfaces of the first waveguide is in contact with the dielectric layer on the plurality of wall surfaces of the first waveguide; and
an image generation unit configured to:
  two-dimensionally scan the light output from the light-emitting device; and
  control brightness of a projection of the light based on image data and the two-dimensional scan of the light output from the light-emitting device.

* * * * *